US012389597B2

(12) United States Patent
Kim

(10) Patent No.: US 12,389,597 B2
(45) Date of Patent: Aug. 12, 2025

(54) MEMORY DEVICE AND METHOD OF MANUFACTURING THE SAME

(71) Applicant: SK hynix Inc., Icheon-si (KR)

(72) Inventor: Jae Taek Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 518 days.

(21) Appl. No.: 17/830,727

(22) Filed: Jun. 2, 2022

(65) Prior Publication Data
US 2023/0217653 A1 Jul. 6, 2023

(30) Foreign Application Priority Data
Jan. 6, 2022 (KR) .......................... 10-2022-0002189

(51) Int. Cl.
*H10B 43/10* (2023.01)
*H10B 41/10* (2023.01)

(52) U.S. Cl.
CPC ............. *H10B 43/10* (2023.02); *H10B 41/10* (2023.02)

(58) Field of Classification Search
None
See application file for complete search history.

(56) References Cited

U.S. PATENT DOCUMENTS

| 11,710,697 | B2* | 7/2023 | Tak ..................... H01L 23/5256 |
| | | | 257/314 |
| 2008/0205176 | A1* | 8/2008 | Jetton ..................... G11C 7/22 |
| | | | 365/205 |
| 2013/0012023 | A1* | 1/2013 | Park ................. H01L 21/31144 |
| | | | 438/689 |
| 2018/0269225 | A1* | 9/2018 | Huang ................... H10B 43/27 |
| 2019/0348127 | A1* | 11/2019 | Chin ..................... G11C 16/08 |
| 2020/0273522 | A1* | 8/2020 | Shin ..................... G11C 16/10 |
| 2021/0125660 | A1* | 4/2021 | Maejima .................. G11C 5/06 |

FOREIGN PATENT DOCUMENTS

| KR | 100886353 B1 | 3/2009 |
| KR | 101271174 B1 | 6/2013 |

* cited by examiner

*Primary Examiner* — Nishath Yasmeen
(74) *Attorney, Agent, or Firm* — WILLIAM PARK & ASSOCIATES LTD.

(57) ABSTRACT

Provided herein may be a memory device and a method of manufacturing the same. The memory device may include a plurality of memory blocks formed on a source line, the plurality of memory blocks separated by a slit, a source contact formed in the slit, a plurality of normal bit lines arranged, in parallel, over the memory blocks, the plurality of normal bit lines being spaced apart in a first direction and extending in a second direction, a plurality of dummy groups disposed between the plurality of normal bit lines, each of the plurality of dummy groups including dummy bit lines, a first dummy pad extending in the first direction and contacting end portions of the dummy groups, a first upper contact formed on the first dummy pad, and a lower contact formed between the dummy bit lines and the source contact.

13 Claims, 28 Drawing Sheets

MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2022-0002189 filed on Jan. 6, 2022, in the Korean Intellectual Property Office, the entire disclosure of which is incorporated by reference herein.

BACKGROUND

1. Technical Field

Various embodiments of the present disclosure relate to a memory device and a method of manufacturing the memory device, and more particularly, to a memory device having a three-dimensional (3D) structure and a method of manufacturing the memory device.

2. Related Art

Memory devices may be classified into a volatile memory device in which stored data is lost when the supply of power is interrupted and a nonvolatile memory device in which stored data is retained even when the supply of power is interrupted.

Examples of the nonvolatile memory device may include a NAND flash memory, a NOR flash memory, a resistive memory (resistive random access memory: ReRAM), a phase-change random access memory (PRAM), a magnetoresistive memory (MRAM), a ferroelectri memory (FRAM), a spin transfer torque memory (STT-RAM), etc.

SUMMARY

An embodiment of the present disclosure may provide for a memory device. The memory device may include a plurality of memory blocks formed on a source line, the plurality of memory blocks being separated by a slit, a source contact formed in the slit, a plurality of normal bit lines arranged, in parallel, over the memory blocks, the plurality of normal bit lines being spaced apart in a first direction and extending in a second direction, a plurality of dummy groups disposed between the plurality of normal bit lines, each of the plurality of dummy groups including dummy bit lines, a first dummy pad extending in the first direction and contacting end portions of the plurality of dummy groups, a first upper contact formed on the first dummy pad, and a lower contact formed between the dummy bit lines and the source contact.

An embodiment of the present disclosure may provide for a method of manufacturing a memory device. The method may include forming memory blocks disposed on a source line and separated from each other by a slit, forming a source contact in the slit, forming a first interlayer insulating layer and a lower contact overlapping with areas of the plurality of memory blocks and the source contact, forming a first pattern on the first interlayer insulating layer and the lower contact, the first pattern being configured to expose portions of the first interlayer insulating layer and the lower contact through a plurality of main openings and a plurality of dummy openings, the plurality of dummy openings having a length that is shorter than a length of the plurality of main openings, forming a plurality of first spacers on side surfaces of the first pattern, removing the first pattern and allowing the plurality of first spacers to remain, forming a plurality of second spacers on side surfaces of the plurality of first spacers, removing the plurality of first spacers and allowing the plurality of second spacers to remain, forming a bit line pattern between the plurality of second spacers, forming a plurality of normal bit lines and a plurality of dummy bit lines by removing the plurality of second spacers, forming an upper contact on a portion of the bit line pattern that is wider than the remaining portions of the bit line pattern, and forming a conductive layer, to which the source voltage is provided, on the upper contact.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms and should not be construed as being limited to the embodiments described in the specification or application.

Various embodiments of the present disclosure are directed to a memory device, which can reduce the resistance of a path through which a source voltage is transmitted by widening the regions of dummy bit lines through which the source voltage is transferred to a source line, and a method of manufacturing the memory device.

Figure 1:
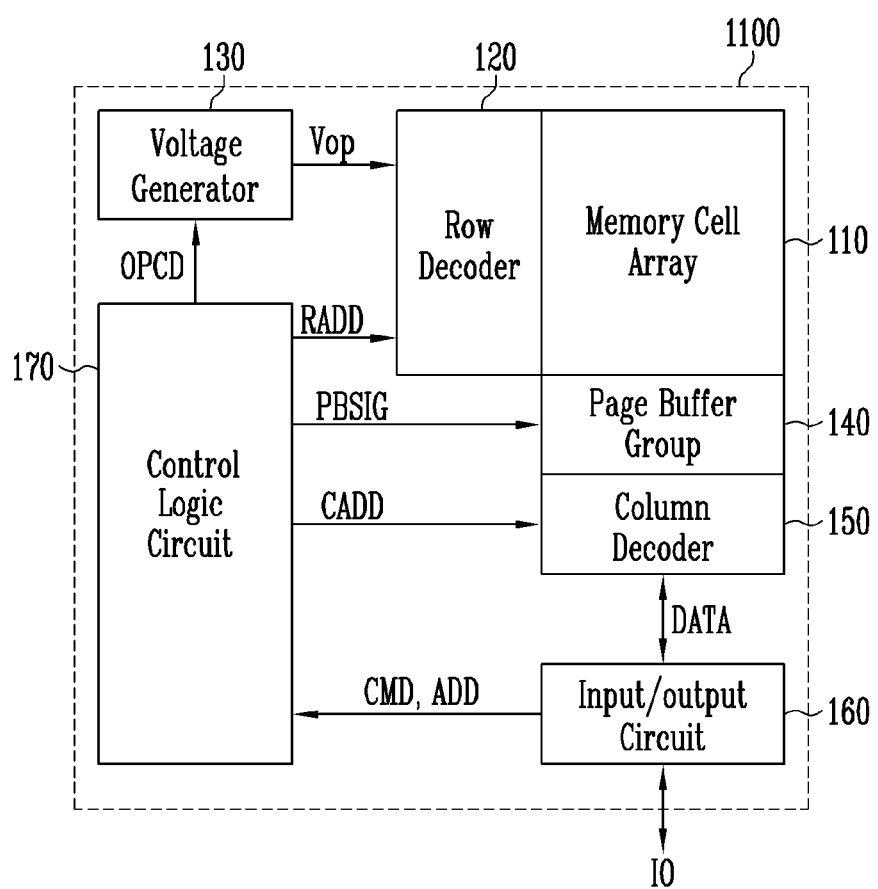
FIG. 1 is a diagram illustrating a memory device according to an embodiment of the present disclosure.

FIG. 1 is a diagram illustrating a memory device according to an embodiment of the present disclosure.

Referring to FIG. 1, a memory device 1100 may include a memory cell array 110 in which data is stored and peripheral circuits 120 to 170, which can perform a program operation, a read operation, or an erase operation.

The memory cell array 110 may include a plurality of memory blocks in which data is stored. Each of the memory blocks includes memory cells, which may be implemented in a three-dimensional (3D) structure in which the memory cells are stacked on a substrate in a vertical direction.

The peripheral circuits 120 to 170 may include a row decoder 120, a voltage generator 130, a page buffer group 140, a column decoder 150, an input/output circuit 160, and a control logic circuit 170.

The row decoder 120 may select one memory block from among the memory blocks that are included in the memory cell array 110 in response to a row address RADD and may transmit operating voltages Vop to the selected memory block.

The voltage generator 130 may generate and output the operating voltages Vop that are required for various operations in response to an operation code OPCD. For example, the voltage generator 130 may generate a program voltage, a read voltage, an erase voltage, a pass voltage, a turn-on voltage, a ground voltage, etc., and the voltage generator 130 may selectively output the generated voltages in response to the operation code OPCD.

The page buffer group 140 may be coupled to the memory cell array 110 through bit lines. For example, the page buffer group 140 may include page buffers that are coupled to respective bit lines. The page buffers may be simultaneously operated in response to page buffer control signals PBSIG and may temporarily store data during a program, a read, or a verify operation. The page buffers may sense the currents of the bit lines that vary with the threshold voltages of memory cells during a read operation or a verify operation.

The column decoder 150 may transfer data DATA between the input/output circuit 160 and the page buffer group 140 in response to a column address CADD.

The input/output circuit 160 may be coupled to an external device through input/output lines IO. For example, the external device may be a controller that can transmit a command CMD, an address ADD, or data DATA to the memory device 1100. The input/output circuit 160 may receive/output the command CMD, the address ADD, and the data DATA through the input/output lines IO. For example, the input/output circuit 160 may transmit the command CMD and the address ADD, received from the external device through the input/output lines IO, to the control logic circuit 170, and the input/output circuit 160 may transmit the data DATA, received from the external device through the input/output lines IO, to the column decoder 150. The input/output circuit 160 may output data DATA, received from the column decoder 150, to the external device through the input/output lines IO.

The control logic circuit 170 may output the operation code OPCD, the row address RADD, the page buffer control signals PBSIG, and the column address CADD in response to the command CMD and the address ADD. For example, the control logic circuit 170 may include software that executes an algorithm in response to the command CMD and hardware that outputs the address ADD and various control signals.

Figure 2:
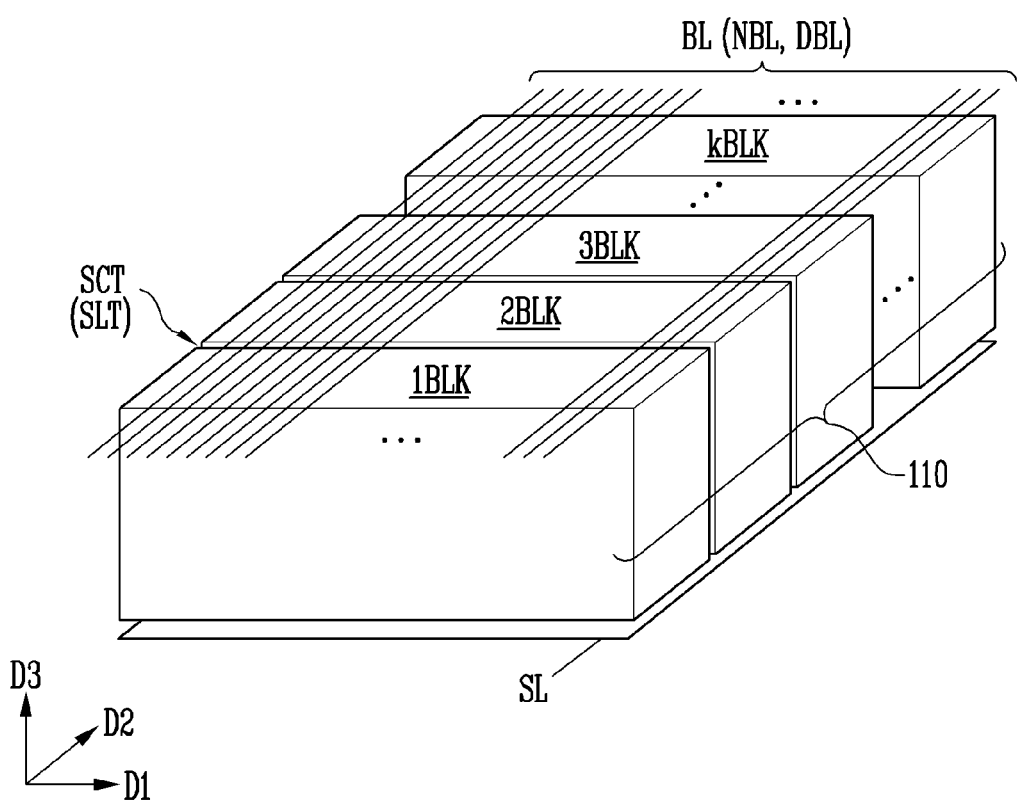
FIG. 2 is a diagram illustrating a memory cell array.

FIG. 2 is a diagram illustrating a memory cell array.

Referring to FIG. 2, the memory cell array 110 may include first to k-th memory blocks 1BLK to kBLK (where k is a positive integer). Each of the first to k-th memory blocks 1BLK to kBLK may include a plurality of memory cells that are stacked on a substrate in a vertical direction D3. The first to k-th memory blocks 1BLK to kBLK may be disposed between a source line SL and bit lines BL. For example, assuming that the bit lines BL are arranged to be spaced apart from each other in a first direction D1 and are formed to extend in a second direction D2 perpendicular to the first direction D1, the first to k-th memory blocks 1BLK to kBLK may be disposed to be spaced apart from each other in the second direction D2. The memory cells that are included in each of the first to k-th memory blocks 1BLK to kBLK may be arranged in the first and second directions D1 and D2 and may be stacked in the third direction D3.

The first to k-th memory blocks 1BLK to kBLK may be separated from each other by slits SLT, each having a trench shape. In each slit SLT, a source contact SCT, made of a conductive material, may be formed. Because gate lines included in the memory blocks are also made of a conductive material, an insulating layer may be formed between each source contact SCT and the memory blocks.

The bit lines BL may include normal bit lines NBL and dummy bit lines DBL. The normal bit lines NBL may be coupled to strings that are included in the first to k-th memory blocks 1BLK to kBLK, and the page buffer group (e.g., 140 of FIG. 1), and the dummy bit lines DBL are not coupled to the strings and the page buffer group (e.g., 140 of FIG. 1). Some of the dummy bit lines DBL may be used to transfer a source voltage to the source line SL, and others may be left floating. When the source voltage that is generated by the voltage generator (e.g., 130 of FIG. 1) is applied to the dummy bit lines DBL used to transfer the source voltage, the dummy bit lines DBL may transmit the source voltage to the source line SL through the source contacts SCT. In other words, the dummy bit lines DBL that transmit the source voltage may electrically connect contacts, through which the source voltage is supplied, and the source contact SCT to each other.

Figure 3:
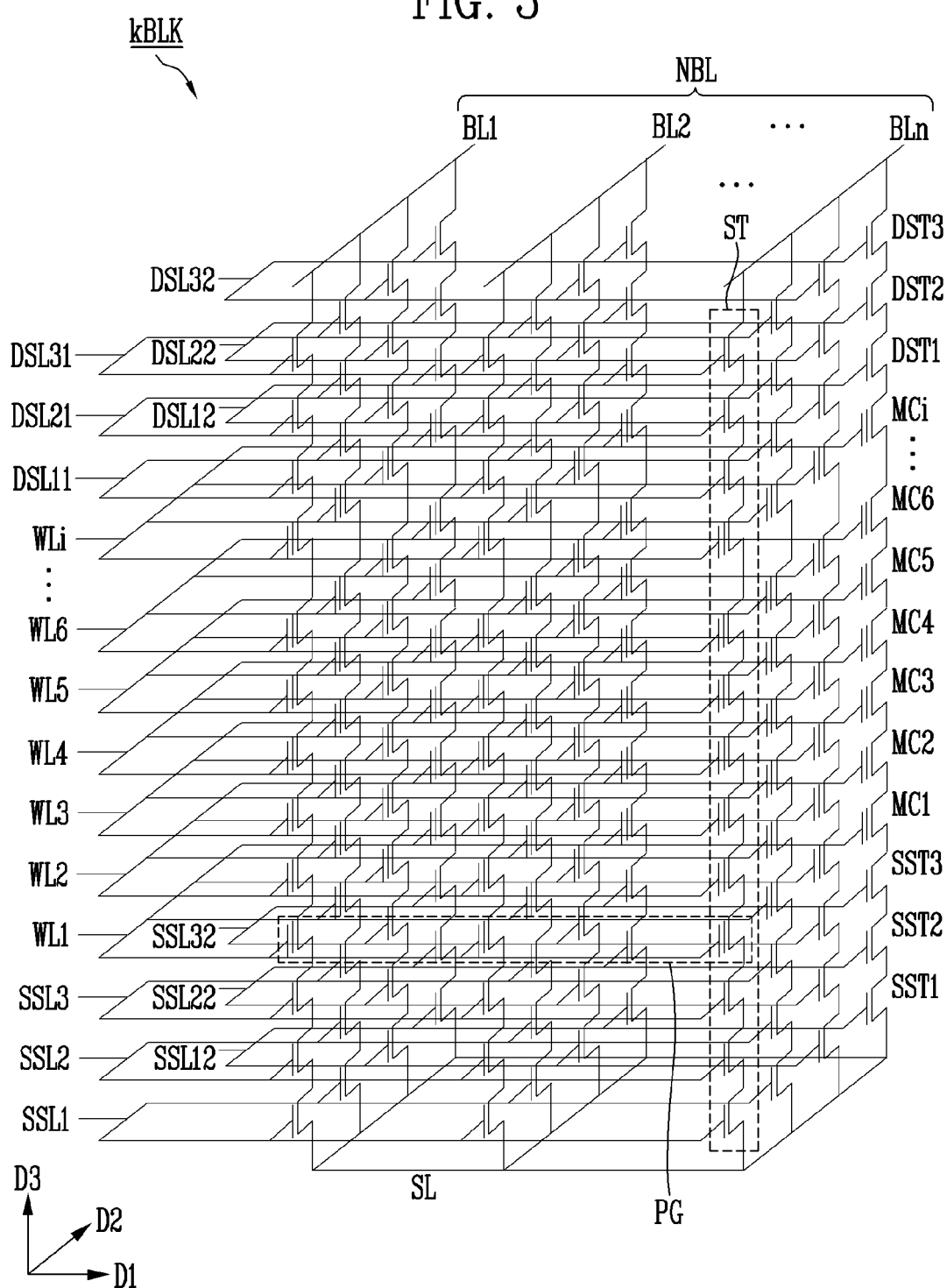
FIG. 3 is a circuit diagram illustrating a memory block.

FIG. 3 is a circuit diagram illustrating a memory block.

Referring to FIG. 3, first to k-th memory blocks (e.g., 1BLK to kBLK of FIG. 2) may be configured in the same manner, and thus, the k-th memory block kBLK is illustrated by way of example.

The k-th memory block kBLK may include strings ST that are coupled between first to n-th bit lines BL1 to BLn and a source line SL. Since the first to n-th bit lines BL1 to BLn extend in a second direction D2 and are arranged to be spaced apart from each other in a first direction D1, the strings ST may also be arranged to be spaced apart from each other in the first and second directions D1 and D2. For example, the strings ST may be arranged between the first bit line BL1 and the source line SL, and the strings ST may be arranged between the second bit line BL2 and the source line SL. In this way, the strings ST may be arranged between the n-th bit line BLn and the source line SL. The strings ST may extend in a third direction D3. The first to n-th bit lines BL1 to BLn that are coupled to the strings ST may be normal bit lines NBL.

Any one of the strings ST that are coupled to the n-th bit line BLn will be described below by way of example. In detail, the string ST may include first to third source select transistors SST1 to SST3, first to i-th memory cells MC1 to MCi, and first to third drain select transistors DST1 to DST3. Since the k-th memory block kBLK, illustrated in FIG. 3, is illustrated for better understanding of the structure of the memory block, the number of source select transistors, memory cells, and drain select transistors, included in each string ST, may be changed according to the memory device.

Gates of the first to third source select transistors SST1 to SST3 that are included in different strings ST may be coupled to first to third source select lines SSL1 to SSD, gates of the first to i-th memory cells MC1 to MCi may be coupled to first to i-th word lines WL1 to WLi, and gates of the first to third drain select transistors DST1 to DST3 may be coupled to 11-th, 12-th, 21-st, 22-nd, 31-st, and 32-nd drain select lines DSL11, DSL12, DSL21, DSL22, DSL31, and DSL32.

For example, the first source select line SSL1 may be coupled in common to first source select transistors SST1 that are arranged at the same distance from the substrate. In other words, the first source select transistors SST1 that are formed on the same layer may be coupled in common to the first source select line SSL1. In this way, the second source select transistors SST2 that are formed on a layer different from that of the first source select transistors SST1 may be coupled in common to the second source select line SSL2, and the third source select transistors SST3 that are formed on a layer different from that of the second source select transistors SST2 may be coupled in common to the third source select line SSL3. The first to third source select lines SSL1 to SSL3 may be formed on different layers, respectively.

In the above-described manner, the i-th memory cells MCi that are formed on the same layer may be coupled in common to an i-th word line WLi, and the first to i-th word lines WL1 to WLi may be formed on different layers, respectively. A group of memory cells that are included in different strings ST and coupled to the same word line may be a page (PG).

The first to third drain select transistor DST1 to DST3 that are included in different strings ST may be coupled to drain select lines that are separated from each other. In detail, the first to third drain select transistors DST1 to DST3 that are arranged in the first direction D1 may be coupled to the same drain select lines, respectively, and the first to third drain select transistors DST1 to DST3 that are arranged in the second direction D2 may be coupled to drain select lines that are separated from each other. For example, some of the first drain select transistors DST1 may be coupled to the 11-th drain select line DSL11, and the remaining first drain select transistors DST1 may be coupled to the 12-th drain select line DSL12. The 12-th drain select line DSL12 may be a line that is separated from the 11-th drain select line DSL11. Therefore, a voltage that is applied to the 11-th drain select line DSL11 may be different from a voltage that is applied to the 12-th drain select line DSL12. In this way, some of the second drain select transistors DST2 may be coupled to the 21-st drain select line DSL21, and the remaining second drain select transistors DST2 may be coupled to the 22-nd drain select line DSL22. Some of the third drain select transistors DST3 may be coupled to the 31-st drain select line DSL31, and the remaining third drain select transistors DST3 may be coupled to the 32-nd drain select line DSL32.

Figure 4:
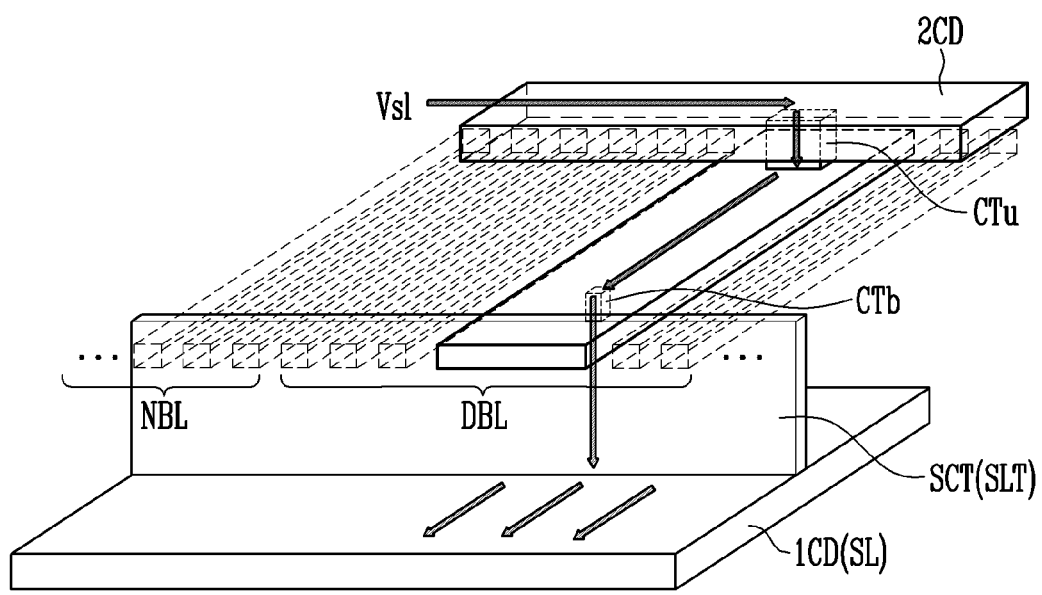
FIG. 4 is a diagram illustrating the structure of a memory device according to an embodiment of the present disclosure.
Figure 4:
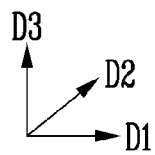

FIG. 4 is a diagram illustrating the structure of a memory device according to an embodiment of the present disclosure.

Referring to FIG. 4, the memory device according to the present embodiment may include a first conductive layer 1CD for a source line SL, a source contact SCT, a lower contact CTb, dummy bit lines DBL, an upper contact CTu, and a second conductive layer 2CD. The first conductive layer 1CD may be formed on a substrate and may be made of polysilicon or made of a metal material such as tungsten or nickel. Although not illustrated in the drawing, a plurality of memory blocks (not illustrated) may be formed on the first conductive layer 1CD and may be separated from each other by a slit SLT. When the slit SLT is formed to extend in a first direction D1, the plurality of memory blocks (not illustrated) may be arranged to be spaced apart from each other in a second direction D2. The slit SLT may be formed in the shape of a trench between the plurality of memory blocks, and the source contact SCT may be formed in the slit SLT. The source contact SCT may be formed of a conductive layer or a metal layer and may contact the first conductive layer 1CD exposed under the slit SLT. Because the source contact SCT is formed of a conductive layer or a metal layer, an insulating layer (not illustrated) may be formed between the source contact SCT and the memory blocks.

The lower contact CTb may be formed on the source contact SCT. The lower contact CTb may be formed of a conductive layer or a metal layer. The normal bit lines NBL and the dummy bit lines DBL may be arranged on the lower contact CTb, and among those bit lines, the dummy bit lines DBL may contact the lower contact CTb. The normal bit lines NBL may be formed in the same plane as the dummy bit lines DBL but might not contact the lower contact CTb. Therefore, the source line SL may be electrically connected to the dummy bit lines DBL through the source contact SCT. Among the dummy bit lines DBL, some lines may float rather than being coupled to the lower contact CTb. The normal bit lines NBL and the dummy bit lines DBL may be arranged to be parallel to each other. For example, the normal bit lines NBL and the dummy bit lines DBL may be formed in the shape of lines that are spaced apart from each other in the first direction D1 and that extend in the second direction D2.

The upper contact CTu may be formed on lines having a relatively large width, among the dummy bit lines DBL. For example, the normal bit lines NBL may have a uniform width and height, and the lengths of the normal bit lines NBL may be different from each other depending on the region coupled to the page buffer group (e.g., 140 of FIG. 1). The heights of the dummy bit lines DBL may be equal to the heights of the normal bit lines NBL, but the widths of the dummy bit lines DBL may be different from each other depending on the region. For example, among the dummy bit lines DBL, some dummy bit lines DBL that are arranged in the region adjacent to the normal bit lines NBL, may have the same width as the normal bit lines NBL. Among the dummy bit lines DBL, some dummy bit lines DBL that are arranged in a region between lines having the same width as the normal bit lines NBL may have a width that is greater than that of the normal bit lines NBL. The width of the dummy bit lines DBL, which is relatively large, may be formed to be equal to or greater than that of the upper contact CTu.

The upper contact CTu may be formed on a line having a relatively large width, among the dummy bit lines DBL. The upper contact CTu may be formed of a conductive layer or a metal layer. The second conductive layer 2CD may be formed on the upper contact CTu. The second conductive layer 2CD may be a line to which a source voltage Vsl output from the voltage generator (e.g., 130 of FIG. 1) is supplied. The source voltage Vsl may have various levels based on the voltage generator (e.g., 130 of FIG. 1). For example, the source voltage Vsl may be a positive voltage, a negative voltage, or a ground voltage. Therefore, when the source voltage Vsl is supplied to the second conductive layer 2CD, the source voltage Vsl may be transferred to the first conductive layer 1CD for the source line SL through the second conductive layer 2CD, the upper contact CTu, the dummy bit lines DBL, the lower contact CTb, and the source contact SCT.

In the present embodiment, an overlay margin between the upper contact CTu and the dummy bit lines DBL may be secured by modifying the layout of the dummy bit lines DBL, and a manufacturing method may be simplified by forming the dummy bit lines DBL using a double spacer patterning method.

The double spacer patterning method may be compared with a single spacer patterning method. The single spacer patterning method may be a technology for forming the patterns of a micro-circuit by using single exposure technology, but the single spacer patterning method is limited in its ability to increase integration due to physical limitations of the exposure technology. The double spacer patterning method may be a technology for overcoming limitations of the single spacer patterning method and may be configured to form a spacer pattern along the sidewall of a base pattern and again form a spacer pattern having a smaller pitch using the spacer pattern as a base pattern.

Figure 5:
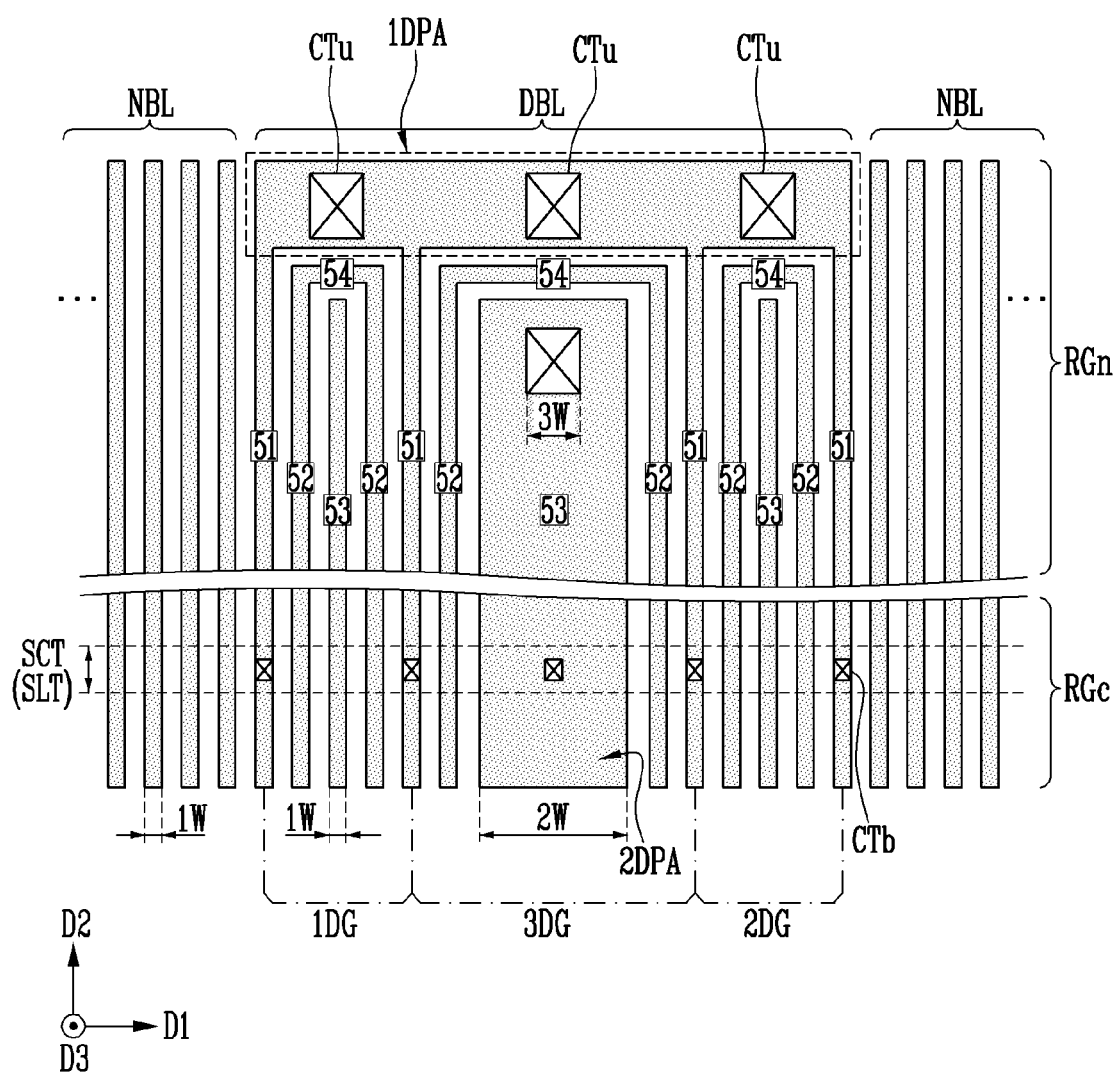
FIG. 5 is a plan view illustrating the layout of a memory device according to an embodiment of the present disclosure.

FIG. 5 is a plan view illustrating the layout of a memory device according to an embodiment of the present disclosure.

Referring to FIG. 5, dummy bit lines DBL may be disposed between normal bit lines NBL. The dummy bit lines DBL and the normal bit lines NBL may extend in a second direction D2 in a connection region RGn and a cell region RGc. The connection region RGn may be a region in which memory cells are not formed, and the cell region RGc may be a region in which memory cells are formed. For example, the region corresponding to the edge of the memory cell array may be the connection region RGn, and an inner region from the edge of the memory cell array to the center of the memory cell array may be the cell region RGc. The normal bit lines NBL may each have a first width 1W and may be arranged to be parallel to each other in the first direction D1. The normal bit lines NBL may electrically connect the strings (e.g., ST of FIG. 3) included in the memory block to the page buffer group (e.g., 140 of FIG. 1). Therefore, voltages or currents that can influence data that is stored in the memory cells or data to be stored therein may be transmitted through the normal bit lines NBL. For example, during a program operation, the memory cells may be programmed or maintained in an erased state depending on the voltage that is applied to the normal bit lines NBL, and during a verify operation, data in the memory cells may be sensed depending on the voltages or currents of the normal bit lines NBL.

The dummy bit lines DBL do not influence the data in the memory cells, unlike the normal bit lines NBL. Some of the dummy bit lines DBL may be used to transfer a source voltage to a source contact SCT. In accordance with the present embodiment, the dummy bit lines DBL may include first to third dummy groups 1DG to 3DG. The first to third dummy groups 1DG to 3DG may be arranged in the first direction D1. For example, the first and second dummy groups 1DG and 2DG may be arranged to be symmetrical to each other with respect to the third dummy group 3DG. The first dummy group 1DG may be disposed between the normal bit lines NBL and the third dummy group 3DG, and the second dummy group 2DG may be disposed between the third dummy group 3DG and the normal bit lines NBL.

Each of the first to third dummy groups 1DG to 3DG may include external lines 51, middle lines 52, and internal lines 53. The external lines 51, the middle lines 52, and the internal lines 53 may be arranged to be parallel to each other in the first direction 1D. The external lines 51 between adjacent dummy groups may be shared between adjacent dummy groups.

The external line 51 that is disposed on the right side of the first dummy group 1DG may be identical to the external line 51 that is disposed on the left side of the third dummy group 3DG, and the external line 51 that is disposed on the right side of the third dummy group 3DG may be identical to the external line 51 that is disposed on the left side of the second dummy group 2DC.

The upper end portions of the external lines 51 (i.e., end portions in the second direction D2) that are included in the first to third dummy groups 1DG to 3DG may come into common contact with a first dummy pad 1DPA that extends in the first direction D1. Since the first dummy pad 1DPA may be arranged on end portions of the dummy bit lines DBL that extend in the second direction D2, the first dummy pad 1DPA may be formed in the connection region RGn. The first dummy pad 1DPA may be greater in size compared to each upper contact CTu. Specifically, the first dummy pad 1DPA may have a width and a length that are greater than those of each upper contact CTu as a plurality of upper contacts CTu may be formed on the first dummy pad 1DPA.

Upper end portions of the middle lines 52 that are included in the first to third dummy groups 1DG to 3DG may contact extension lines 54 that extend in the second direction D2 between the first dummy pad 1DPA and the internal lines 53. That is, the middle lines 52 that are included in each of the first to third dummy groups 1DG to 3DG may be coupled to each other through the corresponding extension line 54. Each extension line 54 may be coupled only to the middle lines 52 and may be disposed to be spaced apart from the first dummy pad 1DPA and the internal line 53.

Each of the internal lines 53 that are included in the first to third dummy groups 1DG to 3DG may be formed in a single line and may have the shape of a line in a portion that is enclosed by the middle lines 52 and the extension line 54.

The internal line 53 that is included in the third dummy group 3DG, among the first to third dummy groups 1DG to 3DG, may have a width that is greater than those of the internal lines 53 that are included in the first and second dummy groups 1DG and 2DG. Therefore, the internal line 53 that is included in the third dummy group 3DG may form a second dummy pad 2DPA.

Assuming that the dummy bit lines DBL, except for the second dummy pad 2DPA, and the normal bit lines NBL have a first width 1W, the second dummy pad 2DPA may have a second width 2W that is greater than the first width 1W. The lower contacts CTb that contact the bottoms of the dummy bit lines DBL may also have the first width 1W. The upper contacts CTu that contact the tops of the first and second dummy pads 1DPA and 2DPA in the connection region RGn may have a third width 3W that is greater than the first width 1W and less than the second width 2W. Here, the term "width" means an interval in the first direction D1. Because the upper contacts CTu are formed on the first and second dummy pads 1DPA and 2DPA, the lengths of the upper contacts CTu in the second direction D2 may be shorter than those of the first and second dummy pads 1DPA and 2DPA in the second direction D2.

The lower contacts CTb may be formed in an area in which the dummy bit lines DBL overlap the source contact SCT in the cell region RGc. For example, the lower contacts CTb may be formed between the dummy bit lines DBL and the source contact SCT in the cell region RGc. The source contact SCT may be formed in the slit SLT, which separates the memory blocks. The slit SLT may be a trench that extends in the first direction D1, and the source contact SCT may be formed in the slit SLT and may contact a source line formed under the slit SLT. The lower contacts CTb may be formed under the dummy bit lines DBL that contacts the upper contacts CTu. The dummy bit lines DBL that do not contact the upper contacts CTu and the lower contacts CTb may be left floating.

In order to minimize the distance at which a source voltage is transferred to the source line that is disposed under the memory block, some of the lower contacts CTb may be formed under the dummy bit lines DBL that are adjacent to the normal bit lines NBL. That is, because memory cells are not formed under the dummy bit lines DBL, lower contacts CTb may be coupled to the dummy bit lines DBL that are adjacent to the normal bit lines NBL, and lower contacts CTb may also be coupled to the dummy bit lines DBL that are not adjacent to the normal bit lines NBL so as to decrease the resistance of a path through which the source voltage is transmitted.

FIGS. 6A to 6H are plan views illustrating a method of manufacturing a memory device according to an embodiment of the present disclosure, FIGS. 7A to 7H are views for explaining a method of manufacturing a memory device according to an embodiment of the present disclosure based on a section taken along line I-I', and FIGS. 8A to 8H are views for explaining the method of manufacturing a memory device according to an embodiment of the present disclosure based on a section taken along line II-II'.

FIGS. 6A to 6H, FIGS. 7A to 7H, and FIGS. 8A to 8H are views for sequentially explaining the manufacturing method, and drawings designated by the same sequence number in FIGS. 6A to 6H, 7A to 7H, and 8A to 8H, respectively, illustrate a plan view and sectional views at the same manufacturing step. For example, FIGS. 6A, 7A, and 8A are plan views or sectional views at the same manufacturing step, and FIGS. 6B, 7B, and 8B are plan views or sectional views at a subsequent manufacturing step.

Figure 6A:
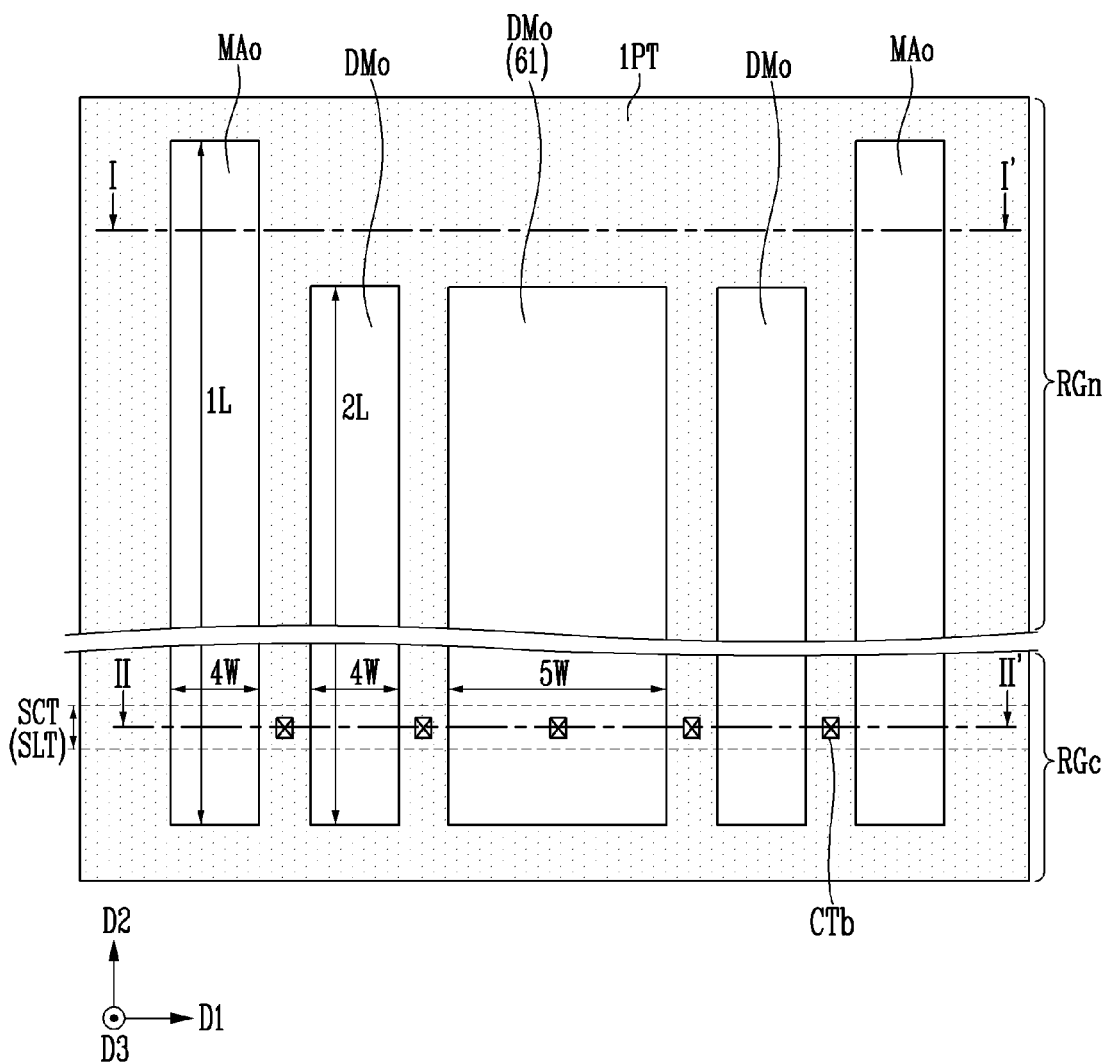
FIGS. 6A to 6H are plan views illustrating a method of manufacturing a memory device according to an embodiment of the present disclosure.
Figure 6B:
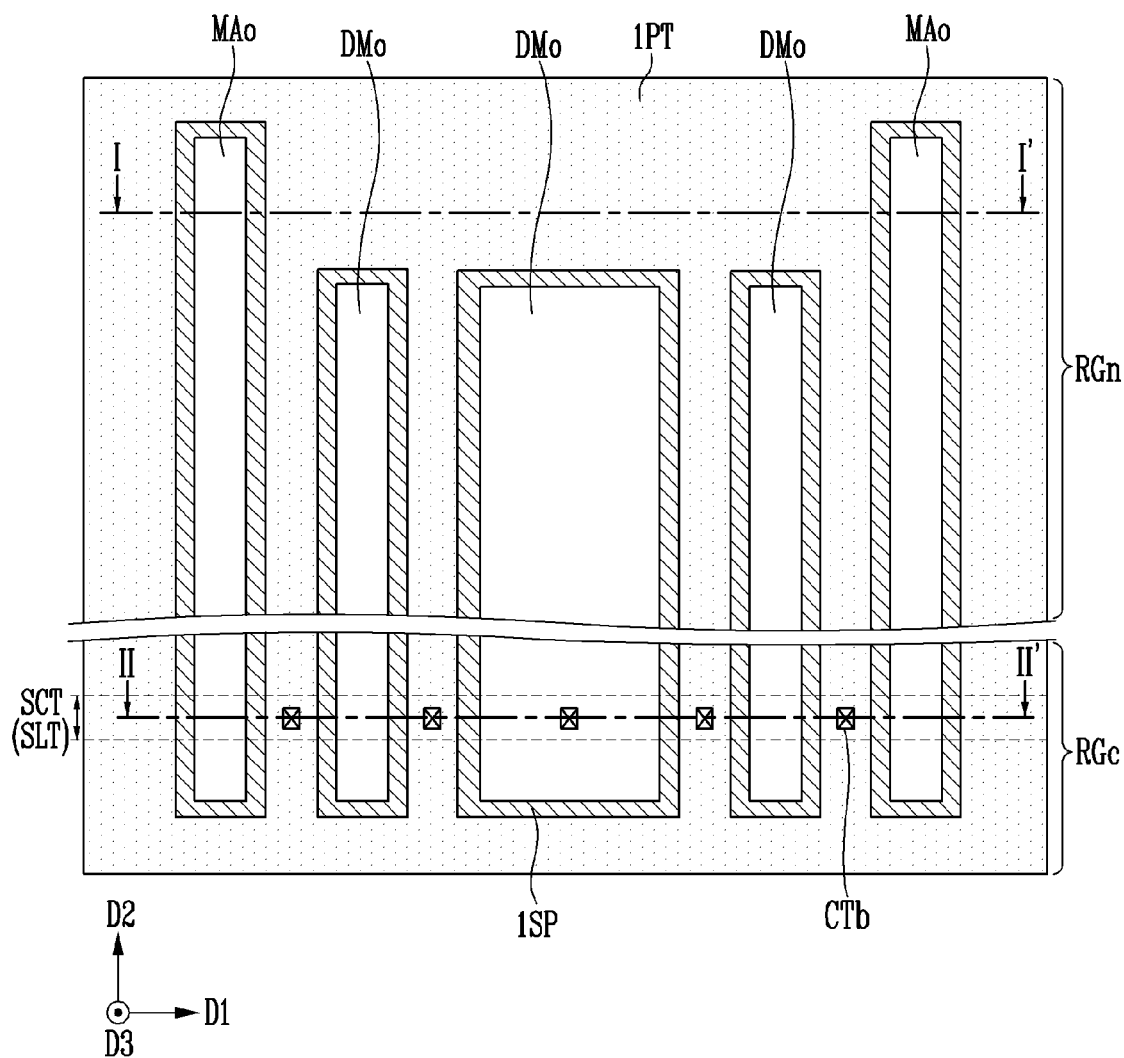
Figure 7A:
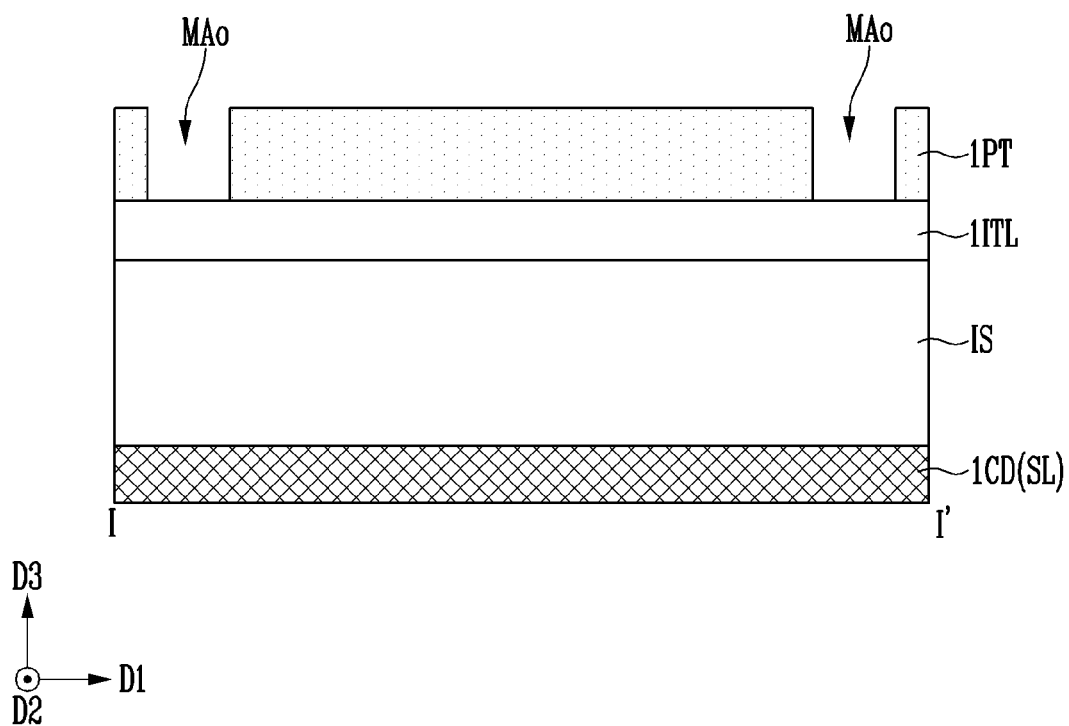
FIGS. 7A to 7H are views illustrating the method of manufacturing a memory device according to an embodiment of the present disclosure based on a section taken along line I-I'.
Figure 7B:
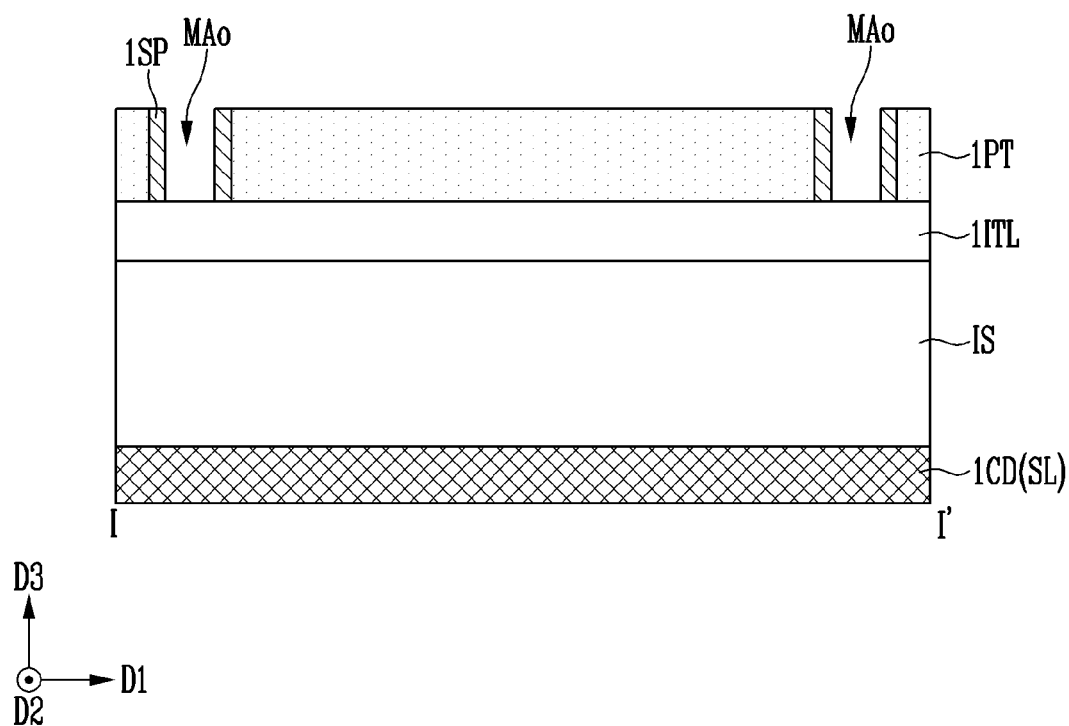
Figure 8A:
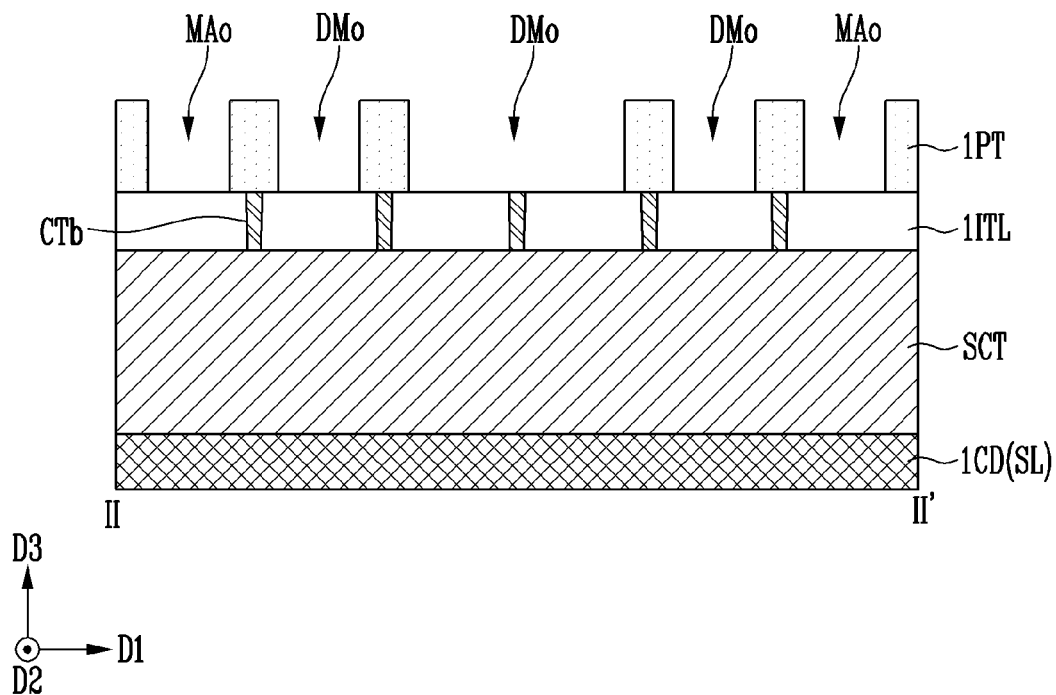
FIGS. 8A to 8H are views illustrating the method of manufacturing a memory device according to an embodiment of the present disclosure based on a section taken along line II-II'.
Figure 8B:
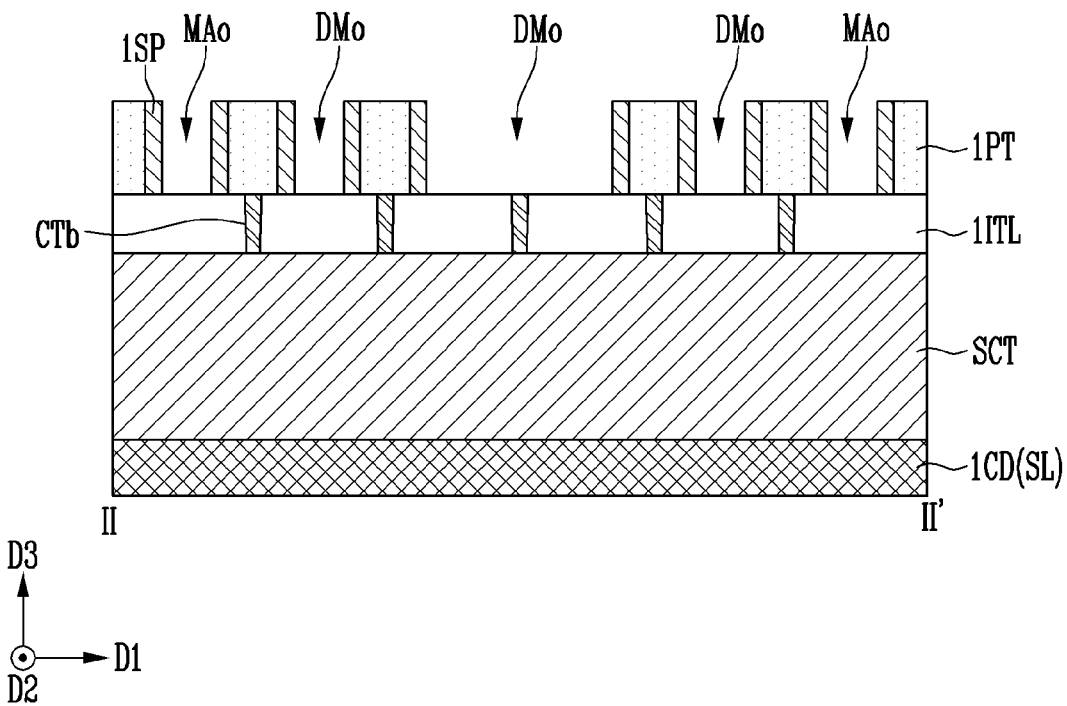

Referring to FIGS. 6A, 7A, and 8A, a first conductive layer 1CD for a source line SL may be formed on a substrate or a lower structure. Here, the lower structure may be a portion of a peripheral circuit structure. The first conductive layer 1CD may be made of polysilicon or a metal material, such as tungsten or nickel. Since the section taken along line I-I' (see FIG. 7A) is the section of a connection region RGn, an insulating layer IS may be formed on the first conductive layer 1CD. Also, since the section that is taken along line II-II' (see FIG. 8A) is the section of a slit SLT between memory blocks that are formed in a cell region RGc, a source contact SCT may be formed on the first conductive layer 1CD for the source line SL. That is, the source contact SCT may be formed in the slit SLT that crosses the memory blocks in the first direction D1.

A first interlayer insulating layer 1ITL may be formed on the insulating layer IS and the source contact SCT. The first interlayer insulating layer 1ITL may be formed of an oxide layer or a silicon oxide layer. Lower contacts CTb may be formed in portions of the first interlayer insulating layer 1ITL that is formed on the source contact SCT, among portions of the first interlayer insulating layer 1ITL. For example, the lower contacts CTb may contact the source contact SCT by passing through the first interlayer insulating layer 1ITL. Each of the lower contacts CTb may be formed of a conductive layer or a metal layer.

A first pattern 1PT for forming normal bit lines and dummy bit lines by using a double spacer patterning method may be formed on the first interlayer insulating layer 1ITL and the lower contacts CTb. The first pattern 1PT may be made of a material having an etch selectivity that is different from that of the first interlayer insulating layer 1ITL. The first pattern 1PT may include main openings MAo and dummy openings DMo, which expose the first interlayer insulating layer 1ITL or expose both the first interlayer insulating layer ITL and the lower contacts CTb. For example, the main openings MAo may expose the first interlayer insulating layer 1ITL, and the dummy openings DMo may expose the first interlayer insulating layer 1ITL or both the first interlayer insulating layer 1ITL and the lower contacts CTb. The dummy openings DMo may be disposed between the main openings MAo. The main openings MAo may have a fourth width 4W and a first length 1L. Here, the term "width" means an interval in the first direction D1, and the term "length" means an interval in the second direction D2. The dummy openings DMo that are adjacent to the main openings MAo may have the fourth width 4W and a second length 2L. The second length 2L may be shorter than the first length 1L. An opening 61 that is formed in a central region, among the dummy openings DMo, may have a fifth width 5W that is greater than the fourth width 4W, and may have the second length 2L.

Referring to FIGS. 6B, 7B, and 8B, first spacers 1SP may be formed along the side surface of the first pattern 1PT. For example, the first spacers 1SP may be formed on the side surface of the first pattern 1PT that is exposed through the main openings MAo and the dummy openings DMo. The first spacers 1SP may be formed by sequentially performing the step of applying a first material layer for spacers and the etching step of removing a portion of the first material layer that is formed on a plane. For example, the first material layer may be formed along the surface of the entire structure in which the first pattern 1PT is formed. Next, an anisotropic etching process for removing the first material layer exposed in the third direction D3 may be performed. When the anisotropic etching process is performed, the first material layer that is formed on the side surface of the first pattern 1PT may remain, and the first material layer that is formed on the first pattern 1PT and on the first interlayer insulating layer 1ITL and the lower contacts CTb may be removed. The first material layer that remains on the side surface of the first pattern 1PT may form the first spacers 1SP.

Figure 6C:
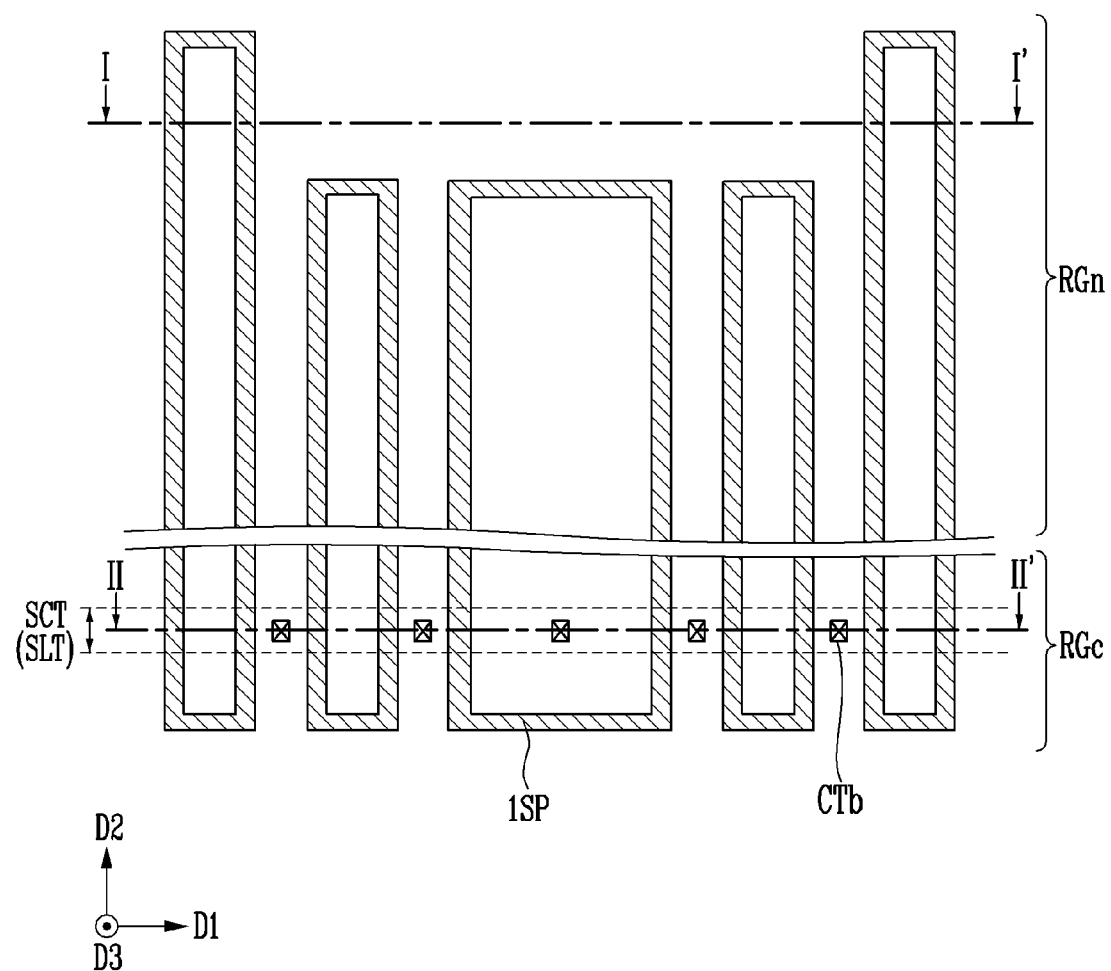
Figure 7C:
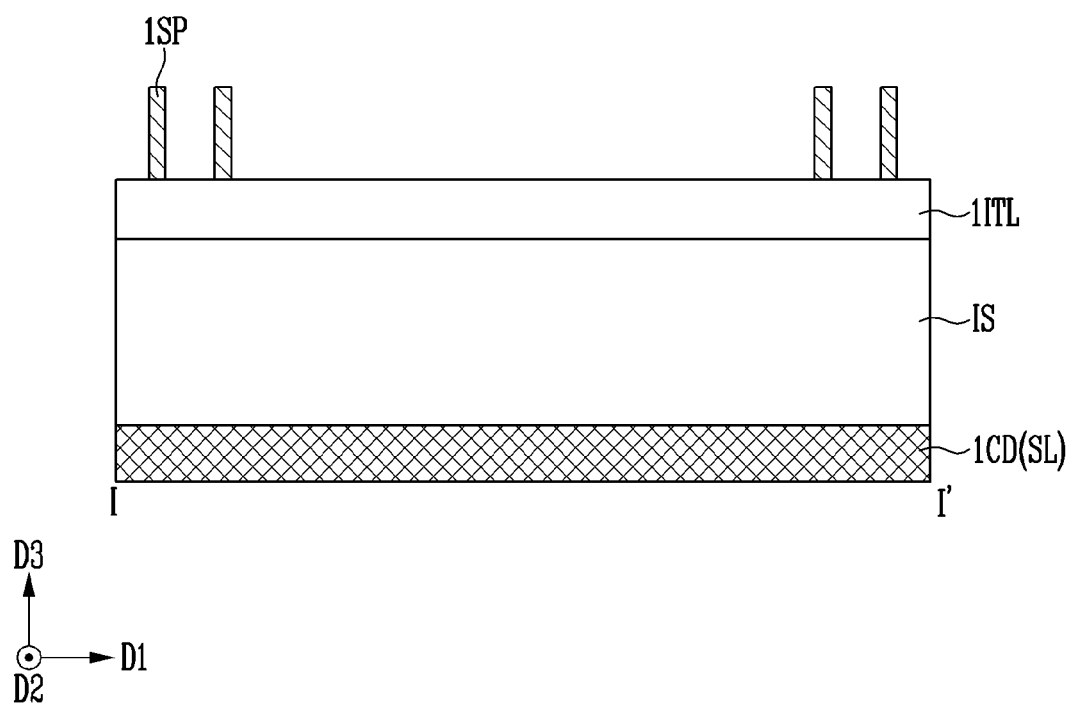
Figure 8C:
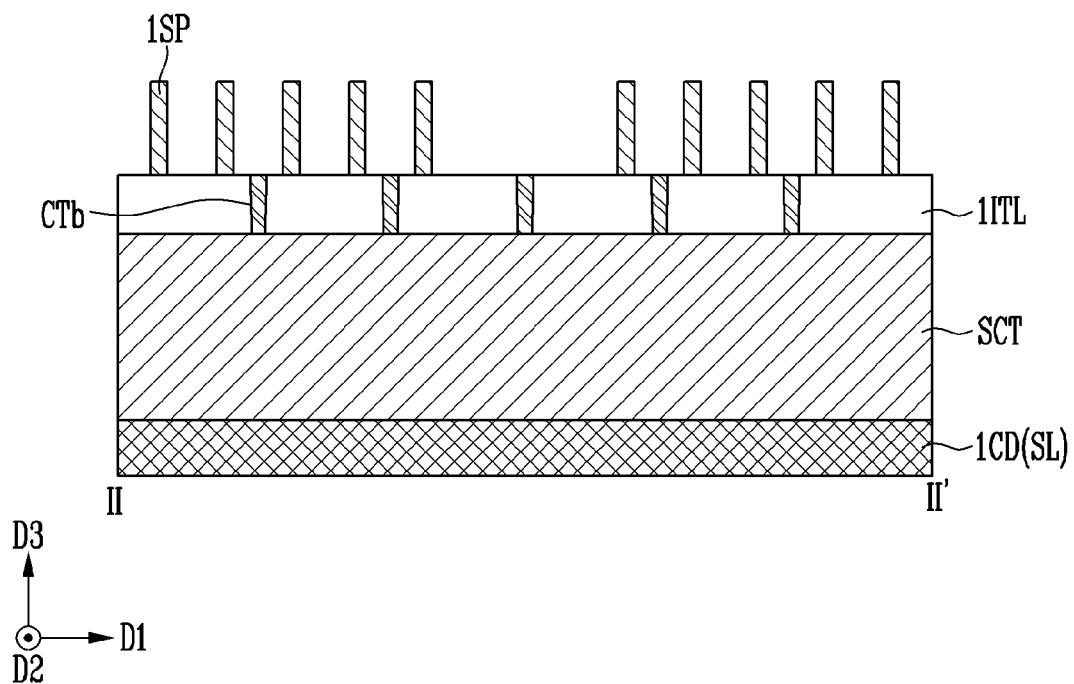

Referring to FIGS. 6C, 7C, and 8C, the first pattern 1PT that is formed on the first interlayer insulating layer 1ITL and the lower contacts CTb may be removed, and the first spacers 1SP may remain. The first pattern 1PT may be removed, and thus, the lower contacts CTb may be exposed through spaces between the first spacers 1SP.

Figure 6D:
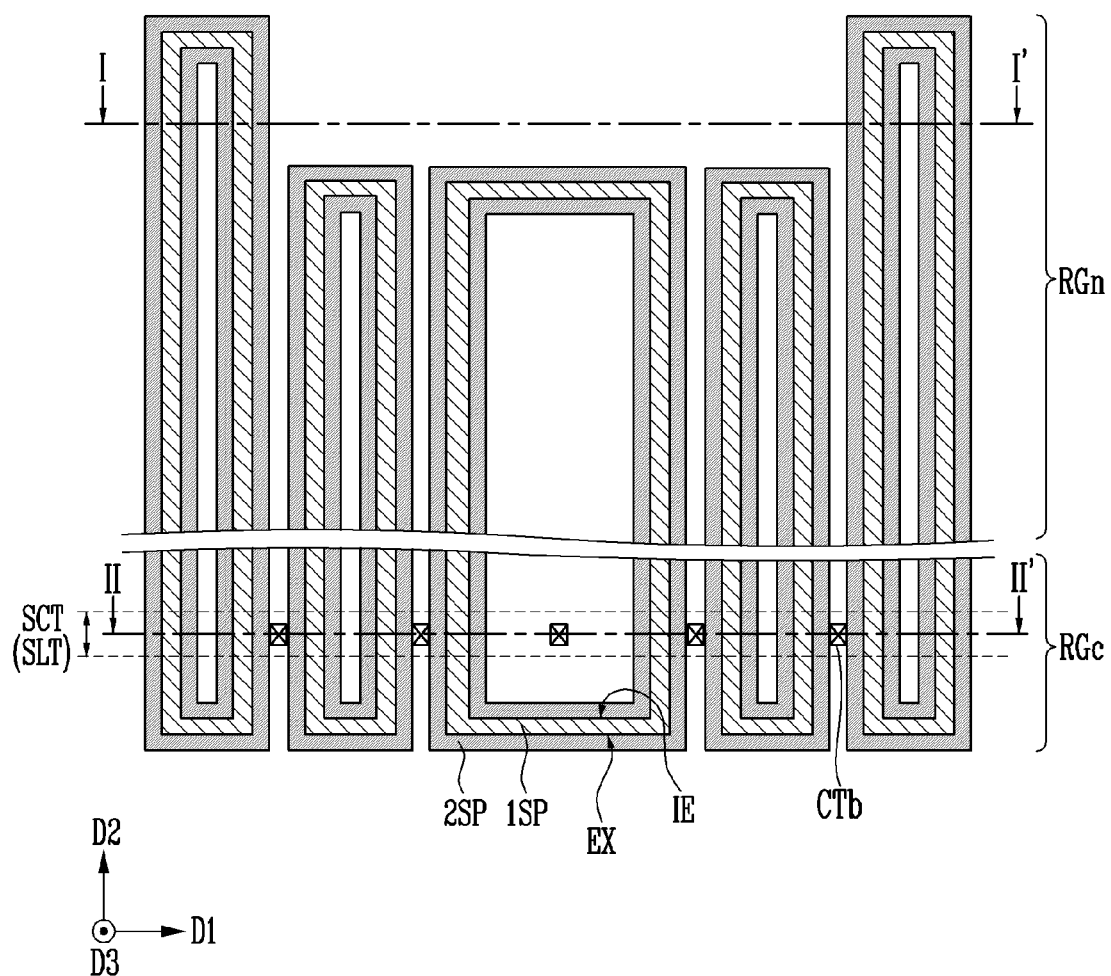
Figure 7D:
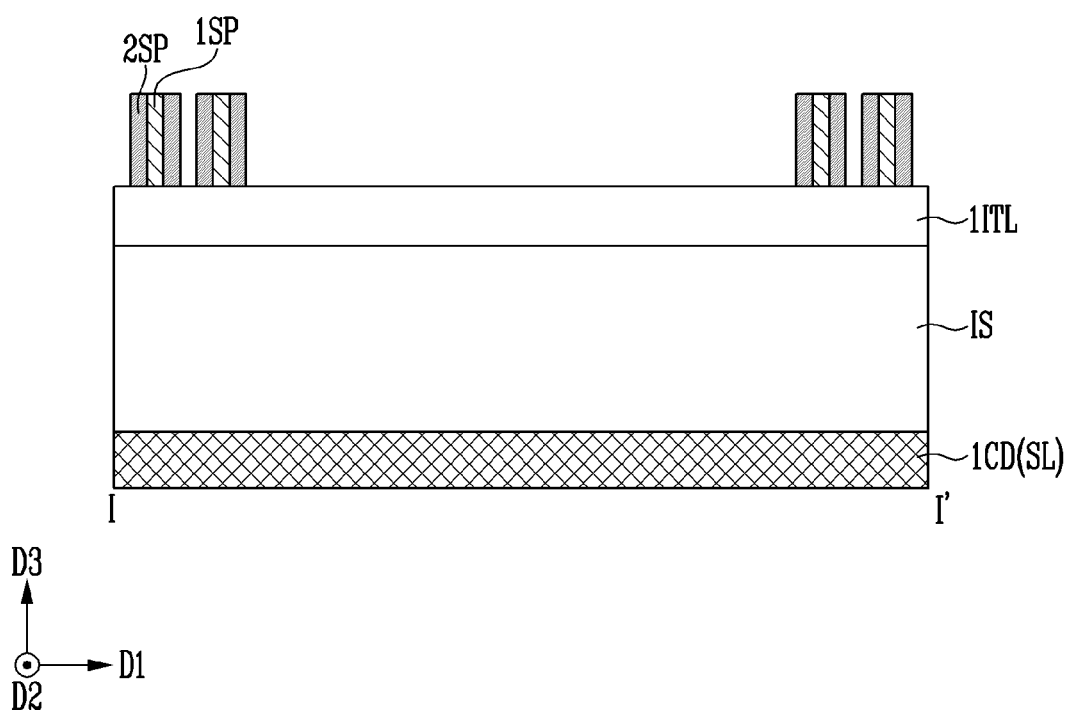
Figure 8D:
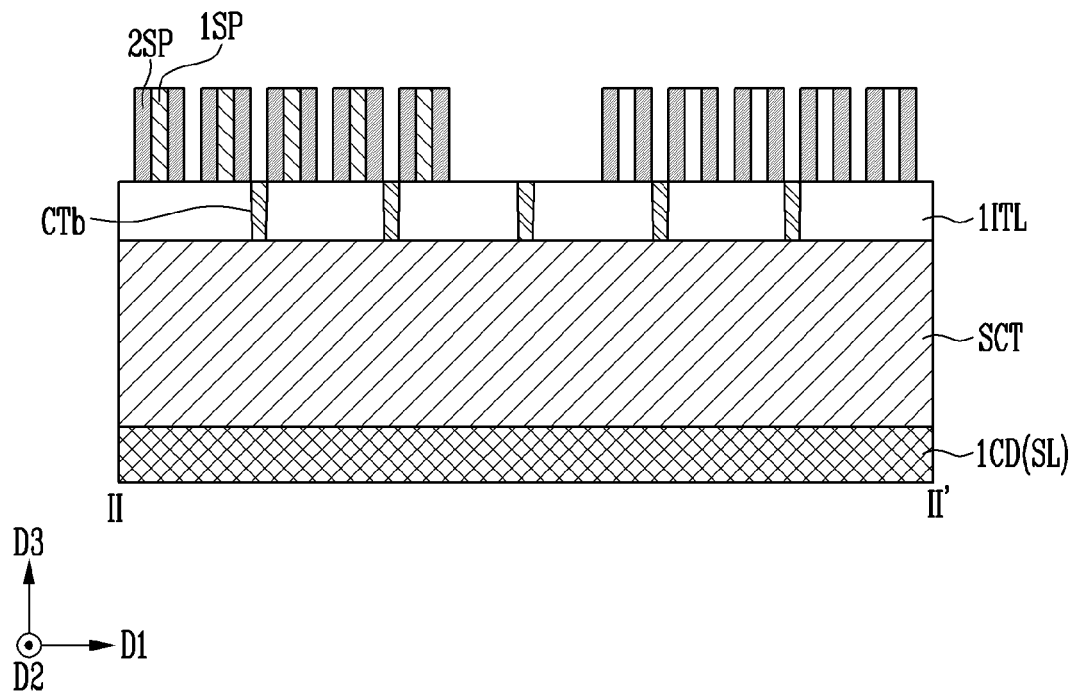

Referring to FIGS. 6D, 7D, and 8D, second spacers 2SP may be formed on side surfaces EX and IE of the first spacers 1SP. For example, the second spacers 2SP may be formed on the external surface EX and the internal surface IE of each of the first spacers 1SP. The second spacers 2SP that are formed on the side surfaces EX and IE of different first spacers 1SP may be formed not to contact each other. For example, a second material layer for spacers may be formed along the surface of the entire structure including the first spacers 1SP. Here, the thickness of the second material layer may be adjusted such that second material layers that face each other on the side surfaces of the first spacers 1SP do not contact each other. The second material layer may be made of a material having an etch selectivity that is different from those of the first spacers 1SP and the first interlayer insulating layer 1ITL. After the second material layer is formed, an anisotropic etching process for removing the second material layer that is formed on a plane may be performed. When the anisotropic etching process is performed, the second material layer that is formed on the side surfaces of the first spacers 1SP may remain, and the second material layer that is formed on the first spacers 1SP and on the first interlayer insulating layer 1ITL or the lower contacts CTb may be removed. After the anisotropic etching process is performed, the second material layer that remains on the side surfaces of the first spacers 1SP may form the second spacers 2SP.

Figure 6E:
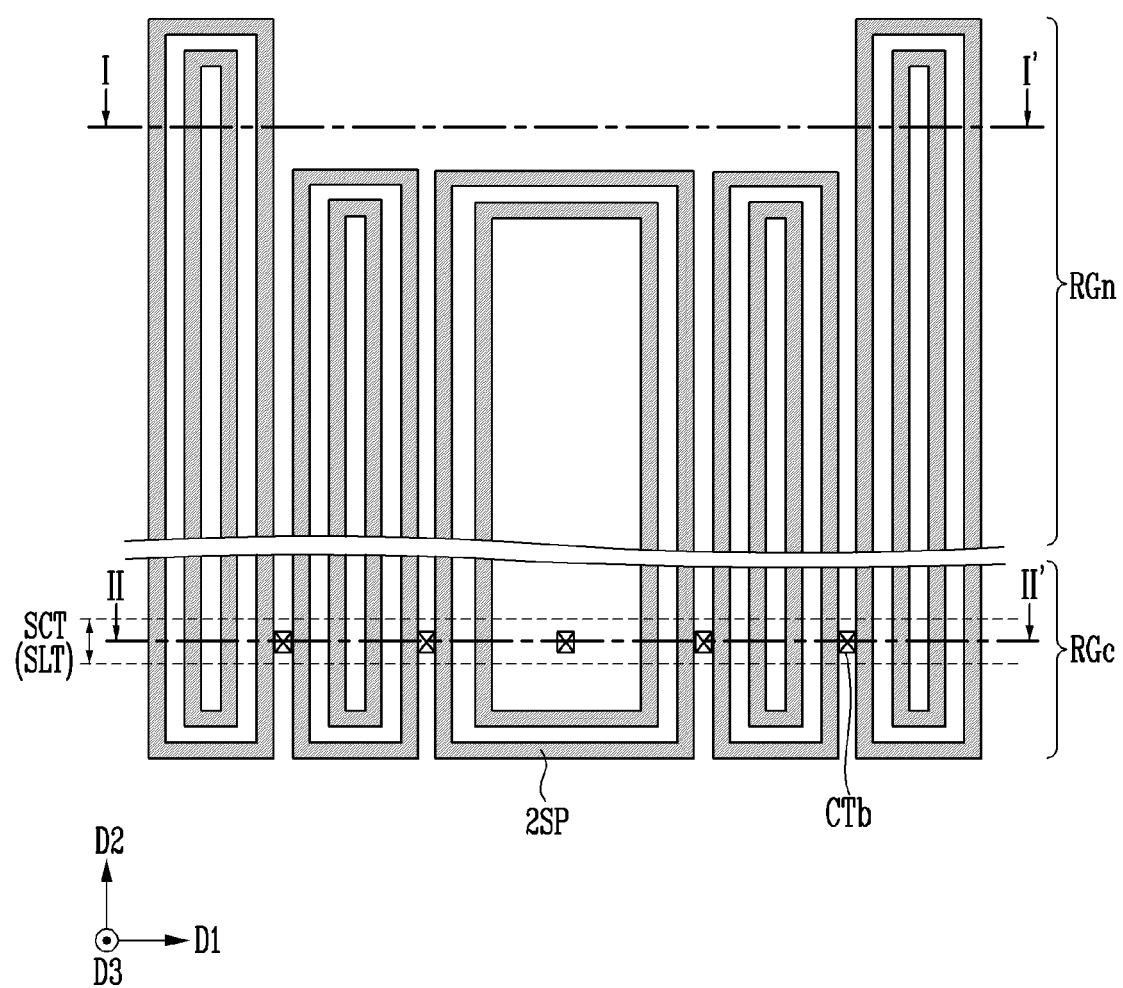
Figure 7E:
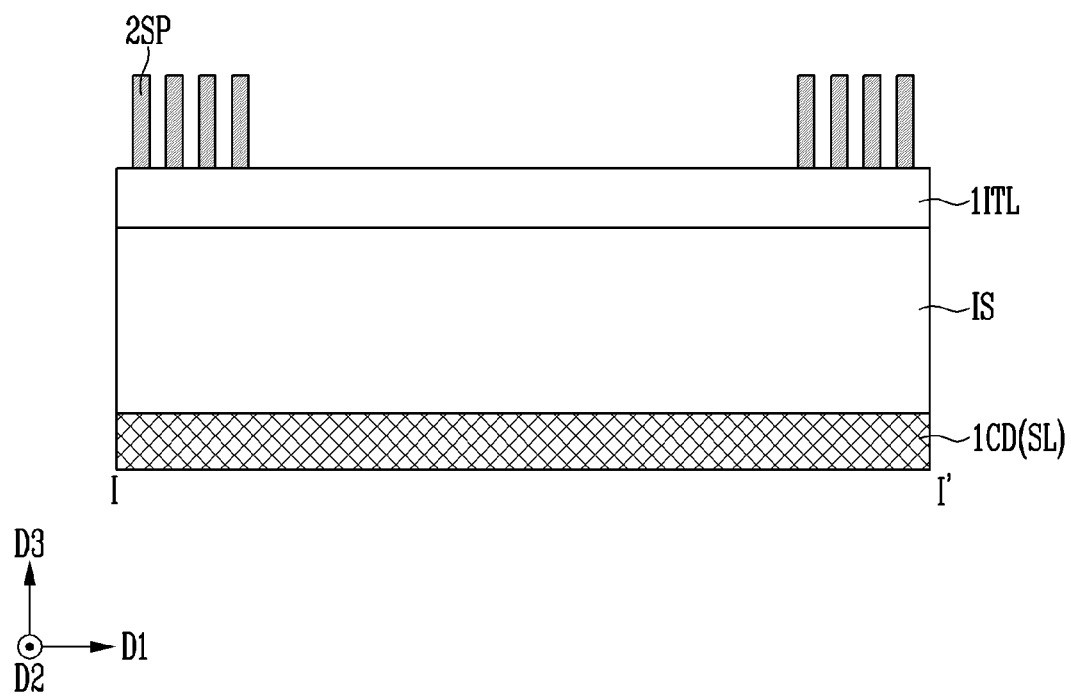
Figure 8E:
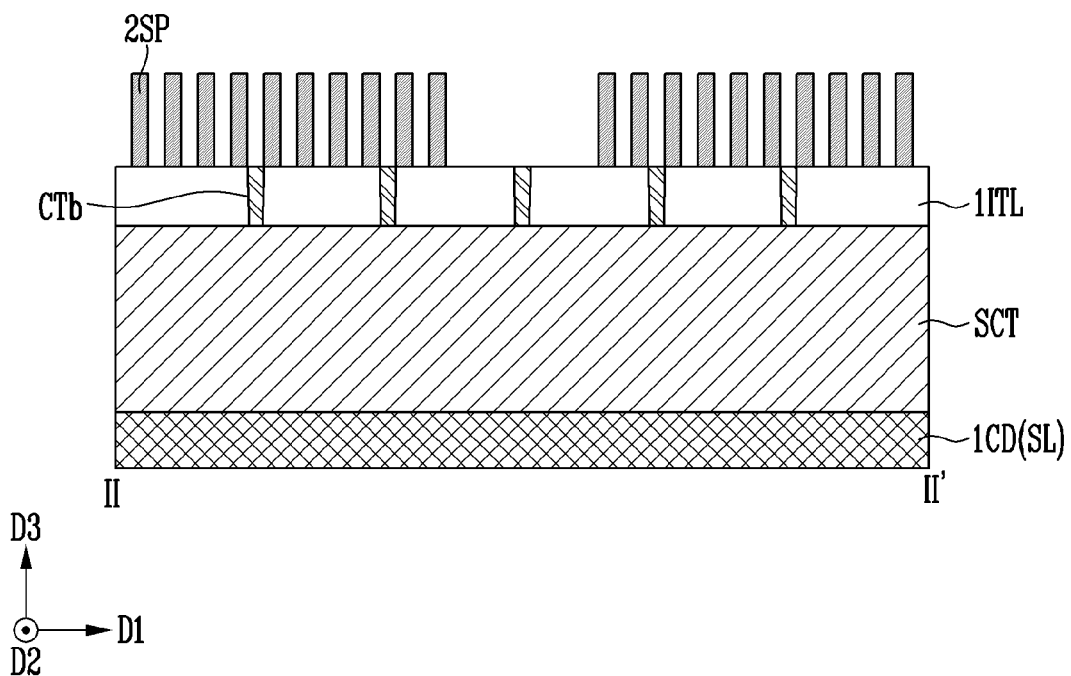

Referring to FIGS. 6E, 7E, and 8E, an etching process for removing the first spacers 1SP that remain between the second spacers 2SP may be performed. When the first spacers 1SP are removed, the lower contacts CTb may be exposed through spaces between the second spacers 2SP.

Figure 6F:
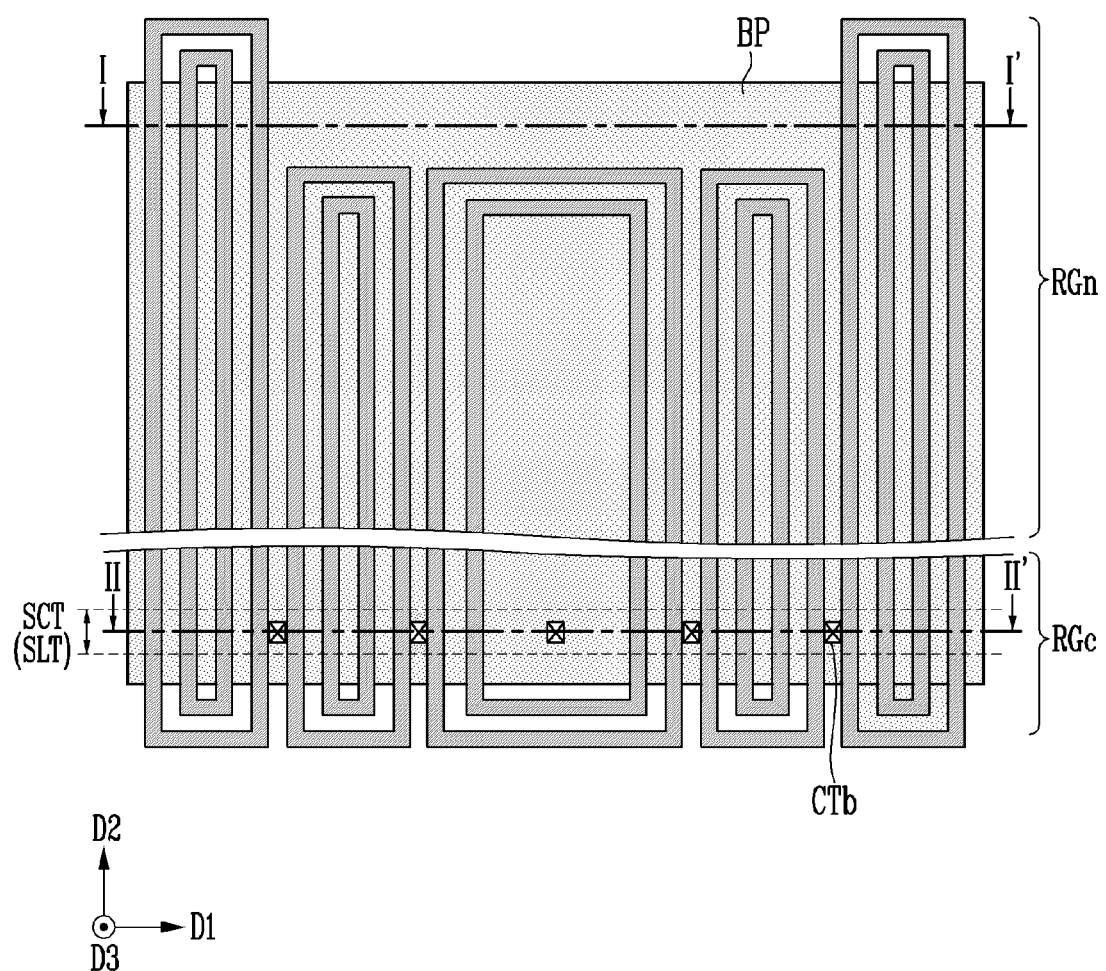
Figure 7F:
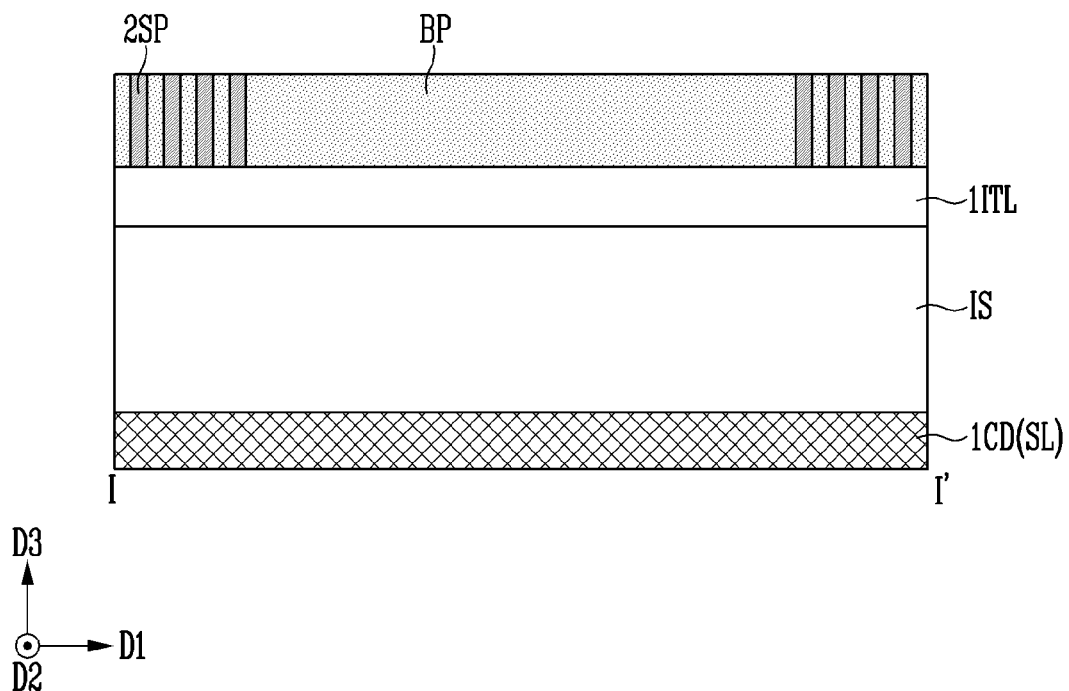
Figure 8F:
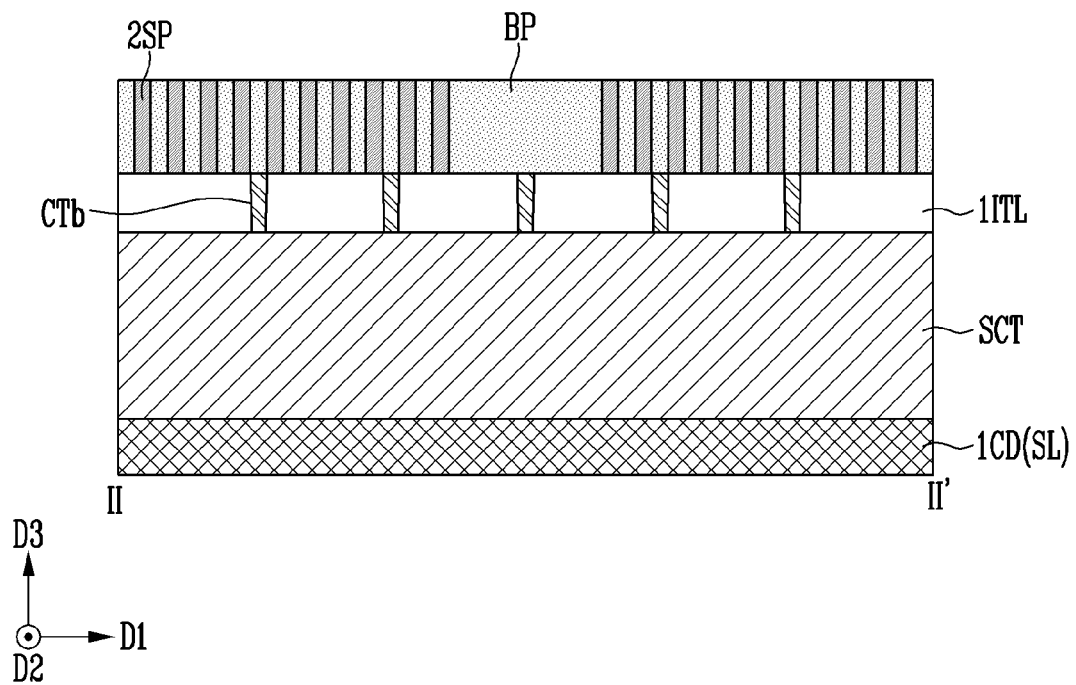

Referring to FIGS. 6F, 7F, and 8F, a bit line pattern BP may be formed between the second spacers 2SP that are arranged in the first direction D1. The bit line pattern BP may be formed of a conductive layer or a metal layer for bit lines. The bit line pattern BP may be formed in a region, except for some upper and lower portions of the second spacers 2SP, so that the normal bit lines are separated from each other, without being formed on the top surface of the entire structure including the second spacers 2SP. For example, the bit line pattern BP may be formed such that upper and lower end portions of the second spacers 2SP that are formed in a normal region and lower end portions of the second spacers 2SP that are formed in a dummy region are exposed. For example, a conductive layer for the bit line pattern BP may be formed on the entire structure including the second spacers 2SP, after which a planarization process may be performed to expose the second spacers 2SP.

Figure 6G:
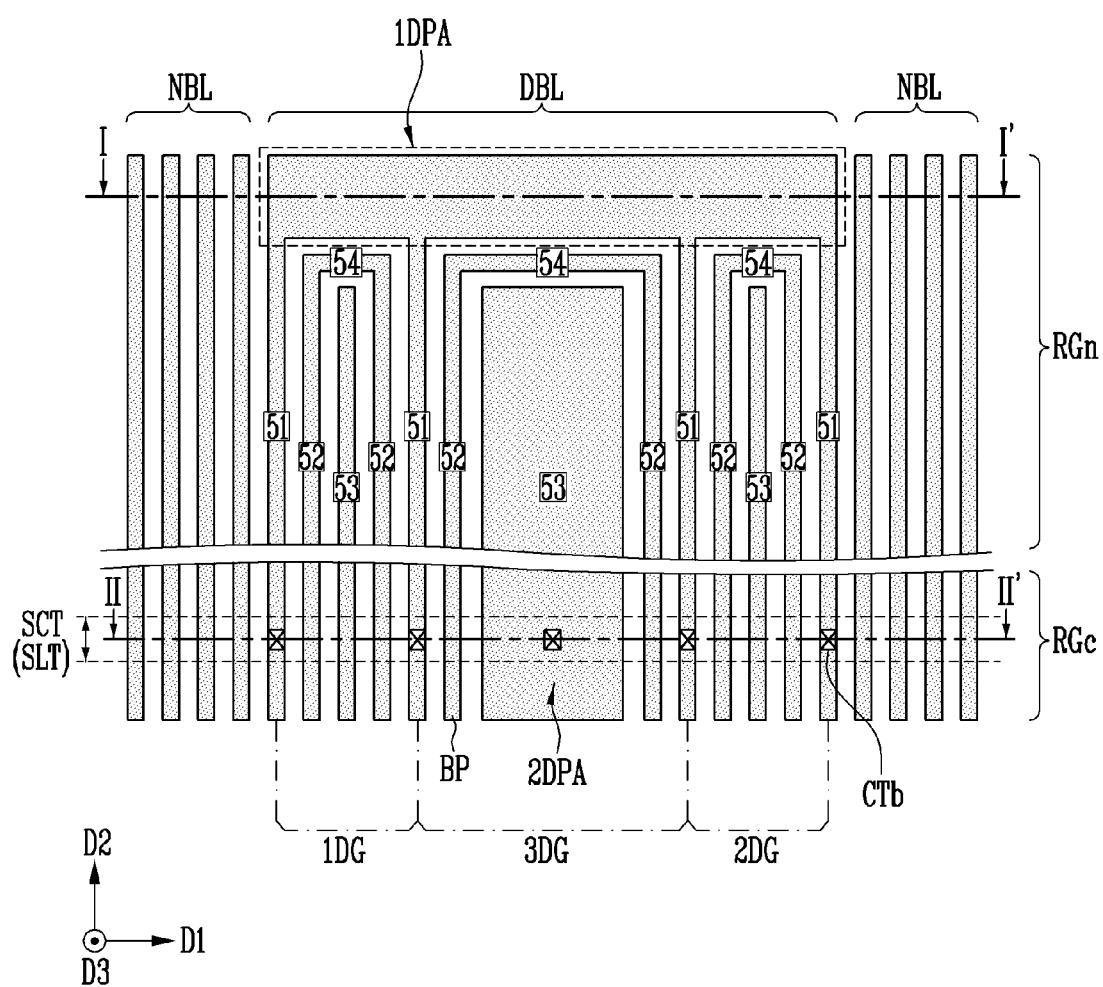
Figure 7G:
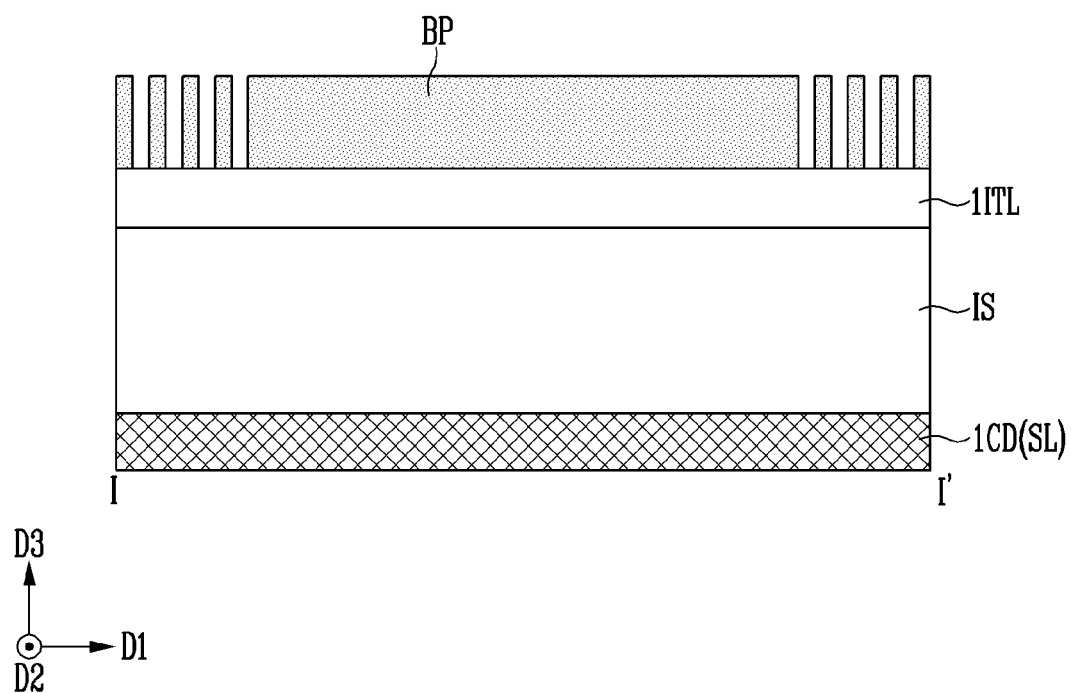
Figure 8G:
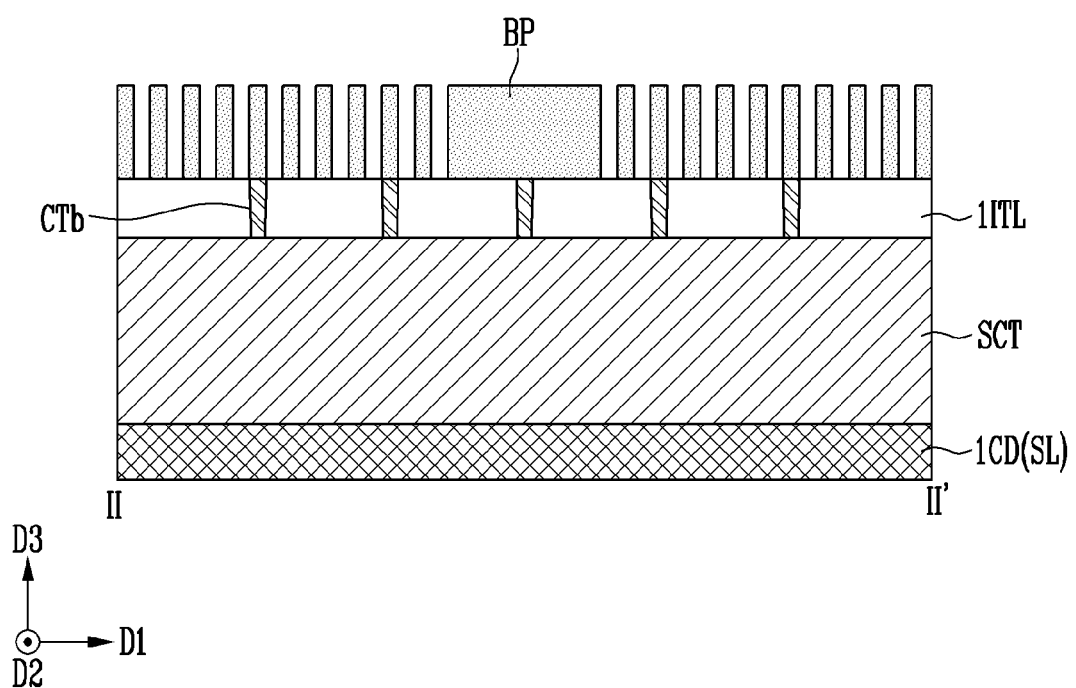

Referring to FIGS. 6G, 7G, and 8G, an etching process for removing the second spacers 2SP may be performed. When the second spacers 2SP are completely removed, the bit line pattern BP may remain on the first interlayer insulating layer 1ITL and the lower contacts CTb. Of the bit line pattern BP, portions that remain in the normal region may form the normal bit lines NBL, and portions that remain in the dummy region may form the dummy bit lines DBL. The normal bit lines NBL may have the shape of lines that extend in the second direction D2 and that are spaced apart from each other.

The dummy bit lines DBL may include first to third dummy groups 1DG to 3DG. The first to third dummy groups 1DG to 3DG may be arranged in the first direction D1. For example, the first and second dummy groups 1DG and 2DG may be arranged to be symmetrical to each other with respect to the third dummy group 3DG. The first dummy group 1DG may be disposed between the normal bit lines NBL and the third dummy group 3DG, and the second dummy group 2DG may be disposed between the third dummy group 3DG and the normal bit lines NBL.

Each of the first to third dummy groups 1DG to 3DG may include external lines 51, middle lines 52, and internal lines 53. The external lines 51, the middle lines 52, and the internal lines 53 may be arranged parallel to each other in the first direction 1D. The external lines 51 between adjacent dummy groups may be shared between the adjacent dummy groups. The external line 51 that is disposed on the right side of the first dummy group 1DG may be identical to the external line 51 that is disposed on the left side of the third dummy group 3DG, and the external line 51 that is disposed on the right side of the third dummy group 3DG may be identical to the external line 51 that is disposed on the left side of the second dummy group 2DC.

The upper end portions of the external lines 51 (i.e., end portions in the second direction D2) that are included in the first to third dummy groups 1DG to 3DG may come into common contact with a first dummy pad 1DPA that extends in the first direction D1. The first dummy pad 1DPA may be arranged in the end portions of the dummy bit lines DBL that extend in the second direction D2 and may be greater in size compared to each upper contact CTu. Specifically, the first dummy pad 1DPA may have as a width and a length that are greater than those of the plurality of upper contacts CTu as a plurality of upper contacts CTu may be formed on the first dummy pad 1DPA.

Upper end portions of the middle lines 52 that are included in the first to third dummy groups 1DG to 3DG may contact extension lines 54 that extend in the second direction D2 between the first dummy pad 1DPA and the internal lines 53. That is, the middle lines 52 that are included in each of the first to third dummy groups 1DG to 3DG may be coupled to each other through the corresponding extension line 54. Each extension line 54 may be coupled only to the middle lines 52 and may be disposed to be spaced apart from the first dummy pad 1DPA and the internal line 53.

Each of the internal lines 53 that are included in the first to third dummy groups 1DG to 3DG may be formed in a single line and may have the shape of a line in a portion that is enclosed by the middle lines 52 and the extension line 54. The internal line 53 that are included in the third dummy group 3DG, among the first to third dummy groups 1DG to 3DG, may have a width that is greater than those of the internal lines 53 that are included in the first and second dummy groups 1DG and 2DG.

Therefore, the internal line 53 that is included in the third dummy group 3DG may form a second dummy pad 2DPA.

Figure 6H:
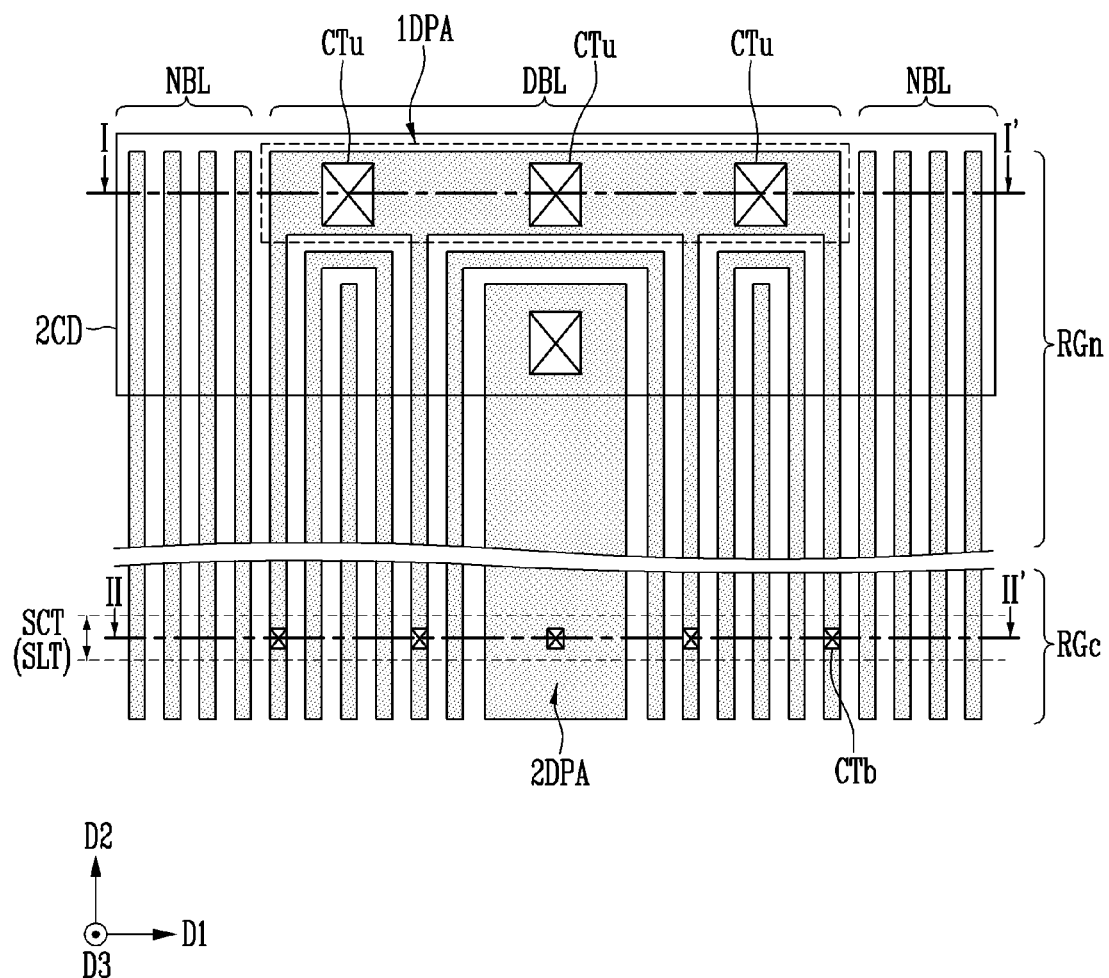
Figure 7H:
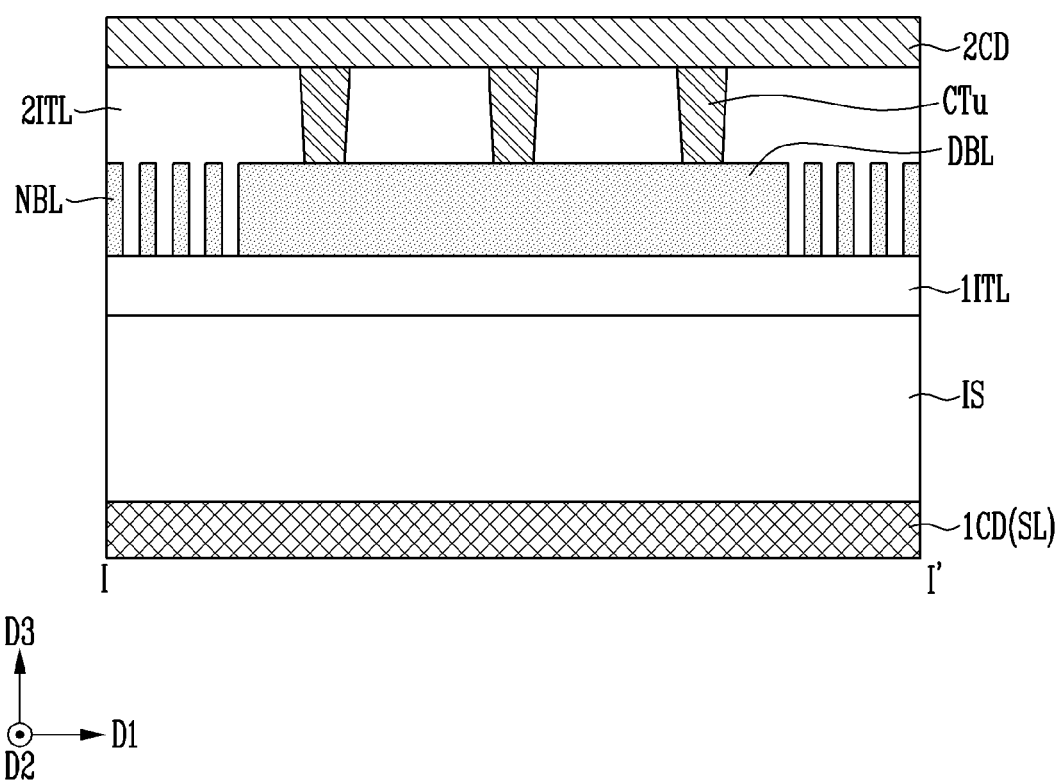
Figure 8H:
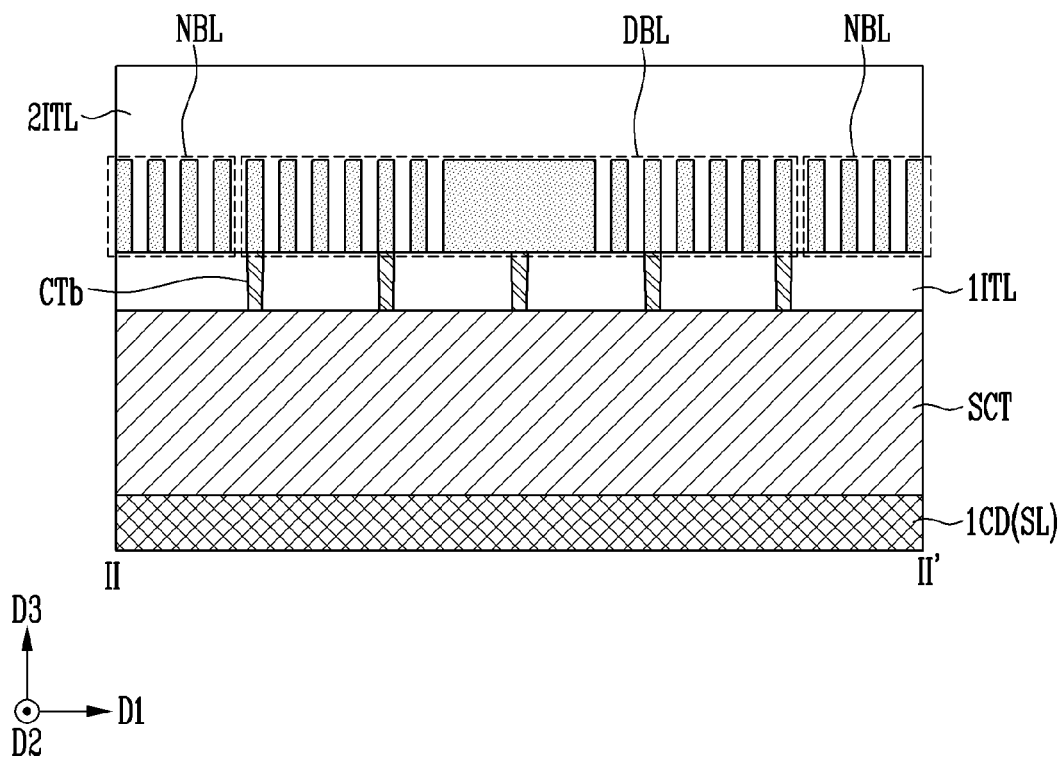

Referring to FIGS. 6H, 7H, and 8H, a second interlayer insulating layer 2ITL may be formed on an entire structure including the normal bit lines NBL and the dummy bit lines DBL. The second interlayer insulating layer 2ITL may be formed of an oxide layer or a silicon oxide layer or may be made of the same material as the first interlayer insulating layer 1ITL. The second interlayer insulating layer 2ITL may be formed to a thickness that is sufficient to cover the normal and dummy bit lines NBL and DBL. Then, the upper contacts CTu may be formed in the second interlayer insulating layer 2ITL that is formed on the first and second dummy pads 1DPA and 2DPA in the connection region RGn. For example, contact holes for exposing portions of the first and second dummy pads 1DPA and 2DPA may be formed in the second interlayer insulating layer 2ITL that is formed on the first and second dummy pads 1DPA and 2DPA. Next, upper contacts CTu may be formed by filling the contact holes with a conductive material. Each of the upper contacts CTu may be formed of a conductive layer or a metal layer. A second conductive layer 2CD may be formed on the upper contacts CTu and the second interlayer insulating layer 2ITL. The second conductive layer 2CD may be a line to which a source voltage that is generated by the voltage generator (e.g., 130 of FIG. 1) is supplied and may contact the upper contacts CTu. Therefore, when the source voltage is supplied to the second conductive layer 2CD, the source voltage may be transferred to the first conductive layer 1CD for the source line SL through the upper contacts CTu, the dummy bit lines DBL, the lower contacts CTb, and the source contact SCT.

Figure 9:
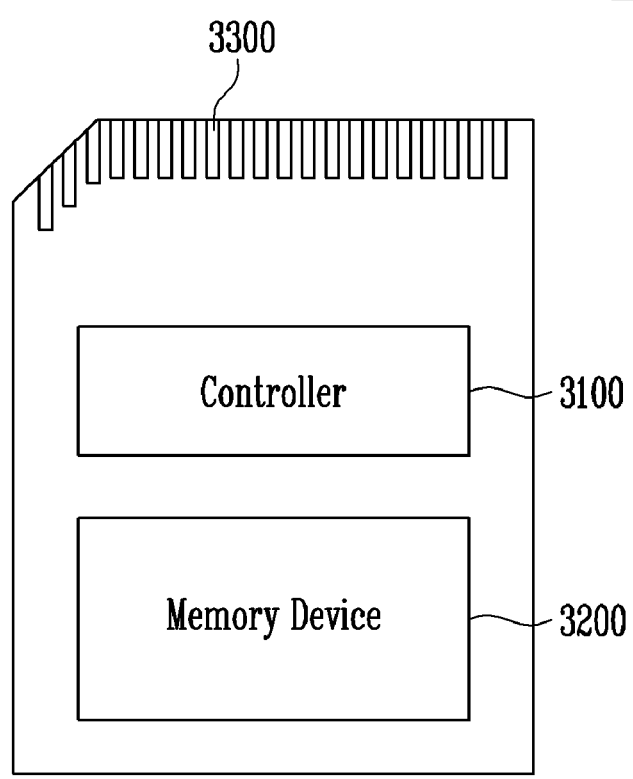
FIG. 9 is a diagram illustrating a memory card system to which a memory device according to the present disclosure is applied.

FIG. 9 is a diagram illustrating a memory card system in which a memory device according to the present disclosure is applied.

Referring to FIG. 9, a memory card system 3000 may include a controller 3100, a memory device 3200, and a connector 3300.

The controller 3100 may be coupled to the memory device 3200. The controller 3100 may access the memory device 3200. For example, the controller 3100 may control a program, a read, or an erase operation of the memory device 3200 or may control a background operation of the memory device 3200. The controller 3100 may provide an interface between the memory device 3200 and a host. The controller 3100 may run firmware for controlling the memory device 3200. In an example, the controller 3100 may include components, such as a random access memory (RAM), a processor, a host interface, a memory interface, and an error correction block.

The controller 3100 may communicate with an external device through the connector 3300. The controller 3100 may communicate with an external device (e.g., a host) based on a specific communication protocol. In an embodiment, the controller 3100 may communicate with the external device through at least one of various communication standards or protocols, such as universal serial bus (USB), multimedia card (MMC), embedded MMC (eMMC), peripheral component interconnection (PCI), PCI-express (PCI-E), advanced technology attachment (ATA) protocol, serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe). In an embodiment, the connector 3300 may be defined by at least one of the above-described various communication protocols.

The memory device 3200 may include a plurality of memory cells and may be configured in the same manner as the memory device 1100 illustrated in FIG. 1.

The controller 3100 and the memory device 3200 may be integrated into a single semiconductor device to form a memory card. For example, the controller 3100 and the memory device 3200 may be integrated into a single semiconductor device and may then form a memory card, such as a personal computer memory card international association (PCMCIA) card, a compact flash card (CF), a smart media card (SM or SMC), a memory stick, a multimedia card (MMC, RS-MMC, MMCmicro or eMMC), an SD card (SD, miniSD, microSD, or SDHC), or a universal flash storage (UFS).

Figure 10:
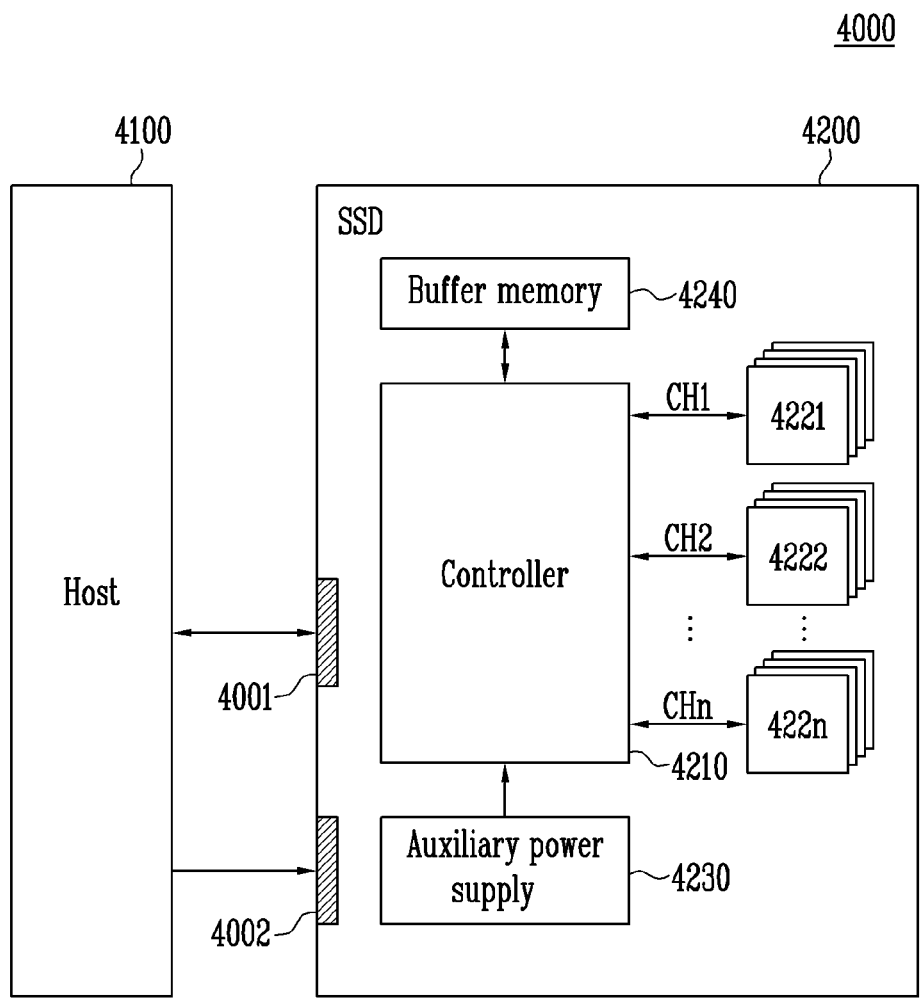
FIG. 10 is a diagram illustrating a solid state drive (SSD) system to which a memory device according to the present disclosure is applied.

FIG. 10 is a diagram illustrating a solid state drive (SSD) system to which a memory device according to the present disclosure is applied.

Referring to FIG. 10, an SSD system 4000 may include a host 4100 and an SSD 4200. The SSD 4200 may exchange a signal with the host 4100 through a signal connector 4001 and may receive power through a power connector 4002. The SSD 4200 may include a controller 4210, a plurality of memory devices 4221 to 422n, an auxiliary power supply 4230, and a buffer memory 4240.

The controller 4210 may control the plurality of memory devices 4221 to 422n in response to signals received from the host 4100. In an embodiment, the received signals may be transmitted based on the interfaces of the host 4100 and the SSD 4200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe).

Each of the plurality of memory devices 4221 to 422n may include a plurality of memory cells in which data can be stored. Each of the memory devices 4221 to 422n may be configured in the same manner as the memory device 1100, illustrated in FIG. 1. The plurality of memory devices 4221 to 422n may communicate with the controller 4210 through channels CH1 to CHn.

The auxiliary power supply 4230 may be coupled to the host 4100 through the power connector 4002. The auxiliary power supply 4230 may be supplied with a power supply voltage from the host 4100 and may be charged. The auxiliary power supply 4230 may provide the power supply voltage of the SSD 4200 when the supply of power from the host 4100 is not smoothly performed. In an embodiment, the auxiliary power supply 4230 may be located inside of the SSD 4200 or located outside of the SSD 4200. For example, the auxiliary power supply 4230 may be located in a main board and may also provide auxiliary power to the SSD 4200.

The buffer memory 4240 may function as a buffer memory of the SSD 4200. For example, the buffer memory 4240 may temporarily store data that is received from the host 4100 or data that is received from the plurality of memory devices 4221 to 422n or may temporarily store metadata (e.g., mapping tables) of the memory devices 4221 to 422n. The buffer memory 4240 may include volatile memories, such as a dynamic random access memory (DRAM), a synchronous DRAM (SDRAM), a double data rate (DDR) SDRAM, and a low power DDR (LPDDR) SDRAM, or nonvolatile memories, such as a ferroelectric RAM (FRAM), a resistive RAM (ReRAM), a spin transfer torque magnetic RAM (STT-MRAM), and a phase-change RAM (PRAM).

In accordance with the present disclosure, the resistance of conductive layers that transfer a source voltage may be reduced.

What is claimed is:

1. A memory device, comprising:
   memory blocks over a source line, the memory blocks being separated by a slit;
   a source contact formed in the slit;
   normal bit lines arranged, in parallel, over the memory blocks, the normal bit lines being spaced apart in a first direction and extending in a second direction;
   dummy groups disposed between the normal bit lines, each of the dummy groups including dummy bit lines;
   a first dummy pad extending in the first direction and contacting end portions of the dummy groups;
   a first upper contact formed on the first dummy pad; and
   a lower contact formed between the dummy bit lines and the source contact.

2. The memory device according to claim 1, wherein the plurality of memory blocks are arranged to be parallel to the first direction.

3. The memory device according to claim 1, wherein the dummy bit lines extend in the second direction and are arranged, in parallel, in the first direction.

4. The memory device according to claim 1, wherein each of the dummy groups comprises:
   external lines arranged, in parallel, in the first direction;
   middle lines arranged, in parallel, between the external lines, in the first direction;
   a connection line configured to couple end portions of the middle lines; and
   an internal line arranged between the middle lines in the first direction.

5. The memory device according to claim 4, wherein the external lines are formed to contact the first dummy pad.

6. The memory device according to claim 4, wherein the internal line is disposed to be spaced apart from the connection line.

7. The memory device according to claim 4, wherein the internal line disposed at a center of a dummy group, among the dummy groups, is used as a second dummy pad.

8. The memory device according to claim 7, wherein dummy bit lines, except for the second dummy pad and the first dummy pad, have a width equal to a width of a normal bit line, among the normal bit lines.

9. The memory device according to claim 7, wherein the second dummy pad has a width that is greater than a width of a normal bit line, among the normal bit lines.

10. The memory device according to claim 7, further comprising:
    a second upper contact formed on the second dummy pad.

11. The memory device according to claim 1, further comprising:
    a conductive layer formed on the first upper contact and configured such that a source voltage that is generated by a voltage generator is supplied to the conductive layer.

12. The memory device according to claim 10, further comprising:
    a conductive layer formed on the first and second upper contacts and configured such that a source voltage that is generated by a voltage generator is supplied to the conductive layer.

13. The memory device according to claim 1, wherein the memory blocks are arranged to be spaced apart from each other in the second direction.

\* \* \* \* \*